(12) United States Patent
Fukuhisa et al.

(10) Patent No.: US 7,408,968 B2
(45) Date of Patent: Aug. 5, 2008

(54) SEMICONDUCTOR LASER DEVICE AND METHOD FOR FABRICATING THE SAME

(75) Inventors: Toshiya Fukuhisa, Osaka (JP); Masaya Mannoh, Hyogo (JP); Hidetoshi Furukawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 32 days.

(21) Appl. No.: 11/489,616

(22) Filed: Jul. 20, 2006

(65) Prior Publication Data
US 2007/0019698 A1    Jan. 25, 2007

(30) Foreign Application Priority Data
Jul. 22, 2005   (JP) ............... 2005-212226

(51) Int. Cl.
*H01S 5/00* (2006.01)
*H01S 3/14* (2006.01)

(52) U.S. Cl. .............. 372/50.121; 372/45.011; 372/46.012; 372/68

(58) Field of Classification Search ............ 372/50.121, 372/46.011, 46.012, 50.122, 68
See application file for complete search history.

(56) References Cited

U.S. PATENT DOCUMENTS

| 2004/0066822 A1* | 4/2004 | Ohkubo | 372/46 |
| 2005/0018728 A1* | 1/2005 | Ohkubo | 372/46 |

FOREIGN PATENT DOCUMENTS

| JP | 2001-57462 A | 2/2001 |
| JP | 2002-026447 | * 1/2002 |

OTHER PUBLICATIONS

Satoshi Arimoto, et al., "150 mW Findamental-Transverse-Mode Operation of 670 n, Window Laser Diode," IEEE Journal of Quantum Electronics, 1993, pp. 1874-1879, vol. 29, No. 6.

* cited by examiner

*Primary Examiner*—Armando Rodriguez
(74) *Attorney, Agent, or Firm*—McDermott Will & Emery LLP

(57) ABSTRACT

A semiconductor laser device includes: a first light emitting device, the first light emitting device including a first first-conductive-type cladding layer, a first active layer having a first window region in the vicinity of a light emitting edge surface and a first second-conductive-type cladding layer stacked in this order on a substrate; and a second light emitting device, the second light emitting device including a second first-conductive-type cladding layer, a second active layer having a second window region in the vicinity of a light emitting edge surface and a second second-conductive-type cladding layer stacked in this order on the substrate. In the semiconductor laser device, respective lattice constants of the first second-conductive-type and second second-conductive-type cladding layers are adjusted to compensate for a difference in diffusion rate of an impurity between the first window region in the first active layer and the second window region in the second active layer.

8 Claims, 7 Drawing Sheets

SEMICONDUCTOR LASER DEVICE AND METHOD FOR FABRICATING THE SAME

CROSS-REFERENCE TO RELATED APPLICATION

The disclosure of Japanese Patent Applications No. 2005-212226 filed on Jul. 22, 2005 including specification, drawings and claims are incorporated herein by reference in its entirety.

BACKGROUND OF THE INVENTION

The present invention relates to semiconductor laser devices, and more particularly relates to a semiconductor laser device used for an optical disc device such as a DVD-RAM, a DVD-R, a DVD-RW, a DVD+R, a DVD+RW, a CD-R, a CD-RW, a DVD-ROM, a CD-ROM, a DVD-Video, a CD-DA, a VCD or the like, optical information processing, optical communication, optical measurement or the like, and a method for fabricating such a device.

Semiconductor laser devices have been used for pickup light sources of optical disc devices and other light sources for optical information processing, optical communication and optical measurement. For example, an AlGaInP based red laser having a wavelength of 650 nm is used as a pickup light source for performing a read/write operation from/onto a DVD-RAM. As another example, an AlGaAs based infrared laser having a wavelength of 780 nm is used as a pickup light source for performing a read/write operation from/onto a CD-R.

To support both of DVD-RAM and CD-R, it is necessary to provide both of a red laser and an infrared laser in a single drive. Therefore, in general, drives including both of an optical integrated unit for DVD and an optical integrated unit for CD have been widely used. In recent years, however, because reduction in the size and cost of drives, simplification of assembling process steps for optical systems and the like are required, there are strong demands for development of drives which can support both of DVD-RAM and CD-R and include a single optical integrated unit.

For this reason, in recent years, double wavelength laser devices in which an AlGaInP based red laser having a wavelength of 650 nm and an AlGaAs based infrared laser having a wavelength of 780 nm are integrated are becoming put into practical use (see, for example, Japanese Laid-Open Publication No. 2001-57462). With use of a double wavelength laser device as a pickup light source, an optical disc device including a laser for both DVD and CD on a single optical integrated unit can be realized.

To perform a data write operation on a DVD-RAM, a CD-R or the like, increase in output power of a semiconductor laser device is required.

However, in a semiconductor laser device, an interface state is formed in part of an active layer located in the vicinity of a light emitting edge surface (this vicinity area will be hereafter referred to be as a "light emitting edge surface vicinity region"), so that non-radiative recombination of carriers is facilitated. Accordingly, in the part of the active layer located in the light emitting edge surface vicinity region, laser light generated in the semiconductor laser device is absorbed to generate heat, thus resulting in increase in temperature.

As an optical output density is increased, a larger amount of laser light is absorbed in the part of the active layer located in the light emitting edge surface vicinity region, so that increase in temperature due to heat generation is accelerated. As a result, finally, the temperature in the part of the active layer located in the light emitting edge surface vicinity region is increased to reach a melting point of a crystal constituting each semiconductor layer. Thus, part of each semiconductor layer located in the light emitting edge surface vicinity region is melted and a laser emission operation is terminated.

As described above, in the semiconductor laser device, the part of each semiconductor layer located in the light emitting edge surface vicinity region is damaged when the semiconductor laser device is in a high power density operation (hereafter, this will be referred to as "optical damage").

As a solution for the above-described problem, semiconductor laser devices having a window structure have been put into practical use.

Hereafter, a method for fabricating a semiconductor laser device having a window structure will be simply described (see, for example, IEEE journal of Quantum Electronics, Vol. 29, No. 6, pp. 1874-1879 (1993)).

First, a plurality of semiconductor layers including an active layer having a multiple quantum well structure are formed on a substrate. Subsequently, a ZnO film is selectively formed over parts of the semiconductor layers located in the light emitting edge surface vicinity region by sputtering. Then, Zn contained in the ZnO film is diffused by annealing so as to reach lower part of the ZnO film in the active layer.

Thus, in part of the active layer in which Zn is diffused, a bandgap can be expanded by disordering the part of the active layer, so that a window region having a larger bandgap than a bandgap of an inner region in the active layer can be formed in the part of the active layer located in the light emitting edge surface vicinity region.

As described above, in the semiconductor laser device having a window structure, a window region having a larger bandgap than the bandgap of the inner region of the active layer is provided in the part of the active layer located in the light emitting edge surface vicinity region.

Thus, in the semiconductor laser device having a window structure, laser light generated in the semiconductor laser device is not absorbed in the part of the active layer located in the light emitting edge surface vicinity region, so that termination of a laser emission operation can be prevented.

As has been described, in a double wavelength laser device, to achieve an infrared laser and a red laser which allow high power operation, a window region has to be formed in each of part of an infrared laser active layer located in a light emitting edge surface vicinity region and part of a red laser active layer located in a light emitting edge surface vicinity region.

However, in a method for fabricating a double wavelength laser device, when Zn diffusion for forming a window region in an infrared laser and Zn diffusion for forming a window region in a red laser are performed in a single step, that is, a infrared laser window region and a red laser window region are formed by a single Zn diffusion step, the following problems arise.

As has been described, in a double wavelength laser device including an infrared laser and a red laser, AlGaAs mixed crystal is used as an infrared laser active layer and AlGaInP mixed crystal is used as a red laser active layer.

In this case, a Zn diffusion rate in AlGaAs mixed crystal is smaller than a Zn diffusion rate in AlGaInP mixed crystal.

Thus, when conditions for the Zn diffusion process step are adjusted so that a necessary amount of Zn for achieving the function of a window structure is diffused in the infrared laser active layer of AlGaAs mixed crystal, an excessive amount of Zn is diffused in the red laser active layer of AlGaInP mixed crystal.

Thus, crystal quality in part of the red laser semiconductor layer located in the light emitting edge surface vicinity region is drastically deteriorated. Furthermore, excessively diffused Zn in the part of the red laser semiconductor layer located in the light emitting edge surface vicinity region reaches even the substrate, thus resulting in electrical short circuit in the semiconductor laser device.

In contrary, when conditions for the Zn diffusion process step are adjusted so that a necessary amount of Zn for achieving the function of a window structure is diffused in the red laser active layer of AlGaInP mixed crystal, a sufficient amount of Zn for achieving the function of a window structure can not be diffused in the infrared laser active layer of AlGaAs mixed crystal.

Accordingly, a preferable window region can not be formed in the part of the infrared laser active layer located in the light emitting edge surface vicinity region, so that laser light generated in the semiconductor laser device is absorbed in the part of the infrared laser active layer located in the light emitting edge surface vicinity region. Thus, the part of the infrared laser semiconductor layer located in the light emitting edge surface vicinity region is melted, so that infrared laser emission operation is terminated.

As described above, in the method for fabricating a double wavelength laser device, a preferable window region can be formed in one of the infrared laser and the red laser but not in the other one by a single Zn diffusion step.

Therefore, in the method for fabricating a double wavelength laser device, when a Zn diffusion step of forming a window region in an infrared laser and a Zn diffusion step of forming a window region in a red laser are separately performed, that is, an infrared laser window region and a red laser window region are formed by separate two Zn diffusion steps, respectively, the following problems arise.

Since the method for fabricating a double wavelength laser device requires two separate Zn diffusion steps, the number of fabrication process steps is increased and thus fabrication cost is increased. Furthermore, in the double wavelength laser device, two separate Zn diffusion steps are performed, so that Zn diffusion step is performed twice to one of an infrared laser and a red laser. Therefore, a yield of the double wavelength laser device is reduced.

SUMMARY OF THE INVENTION

In view of the above-described technical problems, the present invention has been devised. It is therefore an object of the present invention is to provide a semiconductor laser device including excellent infrared and red laser window regions formed by diffusing a proper amount of Zn for achieving the function as a window structure in parts of infrared and red active layers located in the vicinity of a light emitting edge surface by a single Zn diffusion step, and a method for fabricating the semiconductor laser device.

Specifically, to solve the above-described problems, a semiconductor laser device according to a first aspect of the present invention is characterized in that the semiconductor laser device includes a first light emitting device for emitting laser light of a first wavelength, the first light emitting device including a first first-conductive-type cladding layer, a first active layer having a first window region in part thereof located in the vicinity of a light emitting edge surface and a first second-conductive-type cladding layer stacked in this order on a substrate; and a second light emitting device for emitting laser light of a second wavelength, the second light emitting device including a second first-conductive-type cladding layer, a second active layer having a second window region in part thereof located in the vicinity of a light emitting edge surface and a second second-conductive-type cladding layer stacked in this order on the substrate, and a lattice constant of the first second-conductive-type cladding layer and a lattice constant of the second second-conductive-type cladding layer are adjusted so as to compensate for a difference between a diffusion rate of an impurity contained in the first window region in the first active layer and a diffusion rate of an impurity contained in a second window region in the second active layer.

In the semiconductor laser device according to the first aspect of the present invention, the lattice constant of the first second-conductive-type cladding layer and the lattice constant of the second second-conductive-type cladding layer are adjusted so that a difference between the diffusion rate of the impurity contained in the first window region in the first active layer and the diffusion rate of the impurity contained in the second window region in the second active layer. Thus, the diffusion rate of the impurity contained in the first window region in the first second-conductive-type cladding layer and the diffusion rate of the impurity contained in the second window region in the second second-conductive-type cladding layer are adjusted.

Accordingly, in the semiconductor laser device according to the first aspect of the present invention, an effective dose of the impurity which is contained in the first window region, passes through the first second-conductive-type cladding layer and is diffused in the first active layer and an effective dose of the impurity which is contained in the second window region, passes through the second second-conductive-type cladding layer and is diffused in the second active layer are adjusted so that a difference between the diffusion rate of the impurity contained in the first window region in the first active layer and the diffusion rate of the impurity contained in the second window region in the second active layer.

Therefore, in the semiconductor laser device according to the first aspect of the present invention, a proper amount of an impurity for achieving the function as a window structure is diffused in part of the first active layer located in the vicinity of the light emitting edge surface and part of the second active layer located in the vicinity of the light emitting edge surface by a single impurity diffusion step. Thus, the first active layer having the excellent first window region in the part thereof located in the vicinity of the light emitting edge surface and also the second active layer having the excellent second window region in the part thereof located in the vicinity of the light emitting edge surface can be realized, so that a semiconductor laser device capable of high output power operation can be provided.

In the semiconductor laser device according to the first aspect of the present invention, it is preferable that the first active layer is a layer containing AlGaAs, the second active layer is a layer containing AlGaInP, each of the first second-conductive-type cladding layer and the second second-conductive-type cladding layer is a layer containing AlGaInP, and the lattice constant of the first second-conductive-type cladding layer is smaller than a lattice constant of the substrate and smaller than the second second-conductive-type cladding layer.

Thus, for the purpose of compensating for a difference between the diffusion rate of the impurity (i.e., Zn) contained in the first window region (i.e., an infrared laser window region) in the first active layer (i.e., an infrared laser active layer) of AlGaAs and the diffusion rate of the impurity (i.e., Zn) contained in the second window region (i.e., a red laser window region) in the second active layer (i.e., a red laser active layer) of AlGaInP, an adjustment is made so that the lattice constant of the first second-conductive-type cladding layer (i.e., a second-conductive-type infrared laser cladding layer) to be smaller than the lattice constant of the substrate and also smaller than the lattice constant of the second second-conductive-type cladding layer (i.e., a second-conductive-type red laser cladding layer).

Accordingly, in the semiconductor laser device according to the first aspect of the present invention, for the purpose of compensating for a difference between the Zn diffusion rate in the infrared laser active layer and the Zn diffusion rate in the red laser active layer, an adjustment is made so that the Zn diffusion rate in the second-conductive-type infrared laser cladding layer becomes larger than the Zn diffusion rate in the second-conductive-type red laser cladding layer. Thus, an effective dose of Zn which passes through the second-conductive-type infrared laser cladding layer and is diffused in the infrared laser active layer is adjusted to be larger than an effective dose of Zn which passes through the second-conductive-type cladding layer and is diffused in the red laser active layer.

Therefore, in the semiconductor laser device according to the first aspect of the present invention, a proper amount (e.g., $2 \times 10^{18}$ cm$^{-3}$ or more) of Zn for achieving the function as a window structure is diffused in part of the infrared laser active layer located in the vicinity of the light emitting edge surface and part of the red laser active layer located in the vicinity of the light emitting edge surface by a single Zn diffusion step. Thus, the infrared laser active layer having the excellent infrared laser window region in the part thereof located in the vicinity of the light emitting edge surface can be realized and also the red laser active layer having the excellent red laser window region in the part thereof located in the vicinity of the light emitting edge surface can be realized, so that a semiconductor laser device capable of high output power operation can be provided.

In the semiconductor laser device according to the first aspect of the present invention, it is preferable that a lattice mismatch value of the first second-conductive-type cladding layer to the substrate is $-3.0 \times 10^{-3}$ or more and less than $-5.0 \times 10^{-4}$ and a lattice mismatch value of the second second-conductive-type cladding layer to the substrate is $-5.0 \times 10^{-4}$ or more and $2.0 \times 10^{-3}$ or less.

Thus, an adjustment can be made so that the lattice mismatch value of the second-conductive-type infrared laser cladding layer (i.e., the first second-conductive-type cladding layer) becomes smaller than 0 and also smaller than a lattice mismatch value of the second-conductive-type red laser cladding layer (i.e., the second second-conductive-type cladding layer).

Herein, a lattice mismatch value of a second-conductive-type cladding layer to a substrate is a numerical value obtained using an equation of $\mu \times (a1-a0)/a0$ where a lattice constant of a substrate is expressed by $a0$, a lattice constant of the second conductive type cladding layer is expressed by $a1$ and the Poisson's ratio for the second-conductive-type cladding layer is expressed by $\mu$. These values can be obtained from actual measurement in a simple manner using an X ray diffraction device.

In the semiconductor laser device according to the first aspect of the present invention, it is preferable that each of the impurity contained in the first window region and the impurity contained in the second window region contains Zn.

In the semiconductor laser device according to the first aspect of the present invention, it is preferable that the first second-conductive-type cladding layer contains a chemical compound expressed by a general formula of $(Al_xGa_{1-x})_yIn_{1-y}P$ where $0 \leq x \leq 1$ and $0 \leq y \leq 1$, the second second-conductive-type cladding layer contains a chemical compound expressed by a general formula of $(Al_tGa_{1-t})_uIn_{1-u}P$ where $0 \leq t \leq 1$ and $0 \leq u \leq 1$, and x and t satisfy the relationship of $x<t$.

Thus, even when an Al composition ratio x in the second-conductive-type infrared laser cladding layer (i.e., the first second-conductive-type cladding layer) and an Al composition ratio t in the second-conductive-type red laser cladding layer (i.e., the second second-conductive-type cladding layer) satisfy the relationship of $x<t$, an adjustment can be made, by adjusting the composition ratio y and the composition ratio u, so that the Zn diffusion rate in the second-conductive-type infrared laser cladding layer becomes larger than the Zn diffusion rate in the second-conductive-type red laser cladding layer.

For example, the composition ratio y and the composition ratio u are adjusted so that the lattice mismatch value of the second-conductive-type infrared laser cladding layer to the substrate satisfies a range from $-3.0 \times 10^{-3}$ or more and less than $-5.0 \times 10^{-4}$ and the lattice mismatch value of the second-conductive-type red laser cladding layer to the substrate satisfies a range from $-5.0 \times 10^{-4}$ or more and $2.0 \times 10^{-3}$ or less.

Thus, in the semiconductor laser device according to the first aspect of the present invention, even when the composition ratio x and the composition ratio t satisfy the relationship of $x<t$, the Zn diffusion rate in the second-conductive-type infrared laser cladding layer does not become smaller than the Zn diffusion rate in the second-conductive-type red laser cladding layer.

In the semiconductor laser device according to the first aspect of the present invention, it is preferable that a first second-conductive type impurity contained in the first second-conductive-type cladding layer is a different element from the impurity contained in the first window region, and a diffusion rate of the first second-conductive-type impurity in the first second-conductive-type cladding layer is smaller than a diffusion rate of the impurity contained in the first window region in the first second-conductive-type cladding layer.

Thus, not only the concentration of the second second-conductive-type impurity contained in the second-conductive-type red laser cladding layer (i.e., the second second-conductive-type cladding layer) but also the concentration of the first second-conductive-type impurity contained in the second-conductive-type infrared laser cladding layer (i.e., the first second-conductive-type cladding layer) can be increased.

Specifically, a different element from Zn is selected as the first second-conductive-type impurity contained in the second-conductive-type infrared laser cladding layer so that the diffusion rate of the first second-conductive-type impurity in the second-conductive-type infrared laser cladding layer becomes smaller than the Zn (i.e., the impurity contained in the first window region) in the second-conductive-type infrared laser cladding layer. Thus, the first second-conductive-type impurity contained in the second-conductive-type infrared laser cladding layer can be prevented from passing through the second-conductive-type infrared laser cladding layer and being diffused in inner part of the infrared laser active layer, so that the concentration of the first second-conductive-type impurity contained in the second-conductive-type infrared laser cladding layer can be increased.

Also, specifically, in the semiconductor laser device according to the first aspect of the present invention, as has been described, an adjustment is made so that the Zn diffusion rate in the second-conductive-type red laser cladding layer becomes smaller than the Zn diffusion rate in the second-conductive-type infrared laser cladding layer. Thus, even if Zn is selected as the second second-conductive-type impurity contained in the second-conductive-type red laser cladding layer, the second second-conductive-type impurity Zn contained in the second-conductive-type red laser cladding layer does not pass through the second-conductive-type red laser cladding layer and thus is not diffused in inner part of the red laser active layer. Therefore, the concentration of the second second-conductive-type impurity Zn contained in the second-conductive-type red laser cladding layer can be increased.

Thus, in the semiconductor laser device according to the first aspect of the present invention, the concentration of the first second-conductive-type impurity contained in the second-conductive-type infrared laser cladding layer can be increased and also the concentration of the second second-conductive-type impurity contained in the second-conductive-type red laser cladding layer can be increased.

Accordingly, in the semiconductor laser device according to the first aspect of the present invention, a reactive current generated in the infrared laser active layer and the red laser active layer can be reduced, so that heat saturation can be prevented in the infrared laser active layer and the red laser active layer. Therefore, a semiconductor laser device capable of even higher output power operation can be provided.

Furthermore, in the semiconductor laser device according to the first aspect of the present invention, the first second-conductive-type impurity contained in the second-conductive-type infrared laser cladding layer at a high concentration does not pass through the second-conductive-type infrared laser cladding layer and thus is not diffused in the inner part of the infrared laser active layer. Accordingly, non-radiative recombination of carriers is not facilitated, so that degradation of properties of the semiconductor laser device can be prevented.

In the semiconductor laser device according to the first aspect of the present invention, it is preferable that the first second-conductive-type impurity contains Mg.

Thus, since the diffusion rate of the first second-conductive-type impurity (i.e., Mg) in the second-conductive-type infrared laser cladding layer is smaller than the Zn diffusion rate in the second-conductive-type infrared laser cladding layer, the concentration of the first second-conductive-type impurity, i.e., Mg contained in the second-conductive-type infrared laser cladding layer can be increased.

In the semiconductor laser device according to the first aspect of the present invention, it is preferable that each of a concentration of the first second-conductive-type impurity contained in the first second-conductive-type cladding layer and a concentration of a second second-conductive-type impurity contained in the second second-conductive-type cladding layer is $6\times10^{17}$ cm$^{-3}$ or more and $1.6\times10^{18}$ cm$^{-3}$ or less.

Thus, the concentration of the first second-conductive-type impurity (e.g., Mg) contained in the second-conductive-type infrared laser cladding laser can be increased and the concentration of the second second-conductive-type impurity (e.g., Zn) contained in the second-conductive red laser cladding layer can be increased.

In the semiconductor laser device according to the first aspect of the present invention, it is preferable that at least one of the first active layer and the second active layer has a quantum well structure.

A method for fabricating a semiconductor laser device according to the first aspect of the present invention is characterized in that the method includes: a step A) of stacking a first first-conductive-type cladding layer, a first active layer and a first second-conductive-type cladding layer in this order on a substrate; a step B) of stacking a second first-conductive-type cladding layer, a second active layer and a second second-conductive-type cladding layer in this order on the substrate; and a step C) of diffusing by heat treatment an impurity so that the diffused impurity reaches at least in the first active layer and the second active layer, thereby forming a first window region in part of the first active layer located in the vicinity of a light emitting edge surface and a second window region in part of the second active layer located in the vicinity of the light emitting edge surface, and in the step A), a lattice constant of the first second-conductive-type cladding layer is adjusted and in the step B), a lattice constant of the second second-conductive-type cladding layer is adjusted.

In the method for fabricating a semiconductor laser device according to the first aspect of the present invention, in the step A), when a first second-conductive-type cladding layer is formed, a lattice constant of the first second-conductive-type cladding layer is adjusted beforehand and also in the step B), when a second second-conductive-type cladding layer is formed, a lattice constant of the second second-conductive-type cladding layer is adjusted beforehand. Thus, the lattice constant of the first second-conductive-type cladding layer and the lattice constant of the second second-conductive-type cladding layer can be adjusted beforehand so as to compensate for a difference between a diffusion rate of an impurity in the first active layer and a diffusion rate of an impurity in the second active layer.

Accordingly, by the method for fabricating a semiconductor laser device according to the first aspect of the present invention, a diffusion rate of the impurity contained in the first second-conductive-type cladding layer and a diffusion rate of the impurity contained in the second second-conductive-type cladding layer can be adjusted beforehand so as to compensate for a difference between the diffusion rate of the impurity contained in the first active layer and the diffusion rate of the impurity contained in the second active layer. Thus, in the step C), an effective dose of the impurity which passes the first second-conductive-type cladding layer and is diffused in the first active layer and an effective dose of the impurity which passes through the second second-conductive-type cladding layer and is diffused in the second active layer can be adjusted.

Therefore, by the method for fabricating a semiconductor laser device according to the first aspect of the present invention, a proper amount of an impurity for achieving the function as a window structure can be diffused in part of the first active layer located in the vicinity of the light emitting edge surface and part of the second active layer located in the vicinity of the light emitting edge surface. Thus, an excellent first window region can be formed in the part of the first active layer located in the vicinity of the light emitting edge surface and an excellent second window region can be formed in the part of the second active layer located in the vicinity of the light emitting edge surface.

As has been described, by the method for fabricating a semiconductor laser device according to the first aspect of the present invention, excellent first and second window regions can be formed. Thus, the generation of optical damages can be prevented in the part of the first active layer located in the vicinity of the light emitting edge surface and in the part of the second active layer located in the vicinity of the light emitting edge surface, so that a semiconductor laser device capable of high output power operation can be provided.

Also, as has been described, by the method for fabricating a semiconductor laser device according to the first embodiment of the present invention, first and second window regions can be formed by a single impurity diffusion step.

Therefore, improvement of a yield of a semiconductor laser device and reduction in fabrication cost can be achieved.

Moreover, as has been described, by the method for fabricating a semiconductor laser device according to the first aspect of the present invention, a proper amount of an impurity for achieving the function as a window structure can be diffused in the part of the first active layer located in the vicinity of the light emitting edge surface and the part of the second active layer located in the vicinity of the light emitting edge surface.

That is, by the method for fabricating a semiconductor laser device according to the first aspect of the present invention, unlike the known example, excessive diffusion of an impurity in one of the part of the first active layer located in the vicinity of the light emitting edge surface and the part of the second active layer located in the vicinity of the light emitting edge surface can be avoided.

Therefore, by the method for fabricating a semiconductor laser device according to the first aspect of the present invention, excessive diffusion of an impurity in part of an active layer located in the vicinity of a light emitting edge surface and degradation of crystal quality in part of the part can be prevented. Also, an impurity excessively diffused in the part of the active layer located in the vicinity of the light emitting edge surface does not reach the substrate, so that electrical short circuit can be prevented.

In the method for fabricating a semiconductor laser device according to the first aspect of the present invention, it is preferable that in the step A), a concentration of a first second-conductive-type impurity contained in the first second-conductive-type cladding layer is also adjusted, and in the step B), a concentration of a second second-conductive-type impurity contained in the second second-conductive-type cladding layer is also adjusted.

Thus, in the step A), when a first second-conductive-type cladding layer is formed, a concentration of a first second-conductive-type impurity contained in the first second-conductive-type cladding layer is adjusted and in the step B), when a second second-conductive-type cladding layer is formed, a concentration of a second second-conductive-type impurity contained in the second second-conductive-type cladding layer is adjusted, so that the concentration of the first second-conductive-type impurity contained in the first second-conductive-type cladding layer can be increased and also the concentration of the second second-conductive-type impurity contained in the second second-conductive-type cladding layer can be increased.

Thus, by the method for fabricating a semiconductor laser device according to the first aspect of the present invention, a reactive current generated in the first active layer and the second active layer can be reduced, so that heat saturation can be prevented in the first active layer and the second active layer. Therefore, a semiconductor laser device capable of even higher output power operation can be provided.

A semiconductor laser device according to a second aspect of the present invention is characterized in that the semiconductor laser device includes: a first-conductive-type cladding layer; an active layer having a window region in part thereof located in the vicinity of a light emitting edge surface; and a second-conductive-type cladding layer, a lattice constant of the second-conductive-type cladding layer is adjusted based on a diffusion rate of an impurity contained in the window region in the active layer and a second-conductive-type impurity contained in the second-conductive-type cladding layer is a different element from the impurity contained in the window region, and a diffusion rate of the second-conductive-type impurity in the second-conductive-type cladding layer is smaller than a diffusion rate of the impurity contained in the window region in the second-conductive-type cladding layer.

In the semiconductor laser device according to the second aspect of the present invention, the lattice constant of the second-conductive-type cladding layer is adjusted based on the diffusion rate of the impurity contained in the window region in the active layer, so that the diffusion rate of the impurity contained in the window region in the second-conductive-type cladding layer is adjusted. Accordingly, an effective dose of the impurity which passes through the second-conductive-type cladding layer and is diffused in the active layer is adjusted.

Thus, in the semiconductor laser device according to the second aspect of the present invention, a proper amount of an impurity for achieving the function as a window region is diffused in a simple manner in the part of the active layer located in the vicinity of the light emitting edge surface. Therefore, an active layer having an excellent window region in the part thereof located in the vicinity of a light emitting edge surface can be realized in a simple manner.

Furthermore, in the semiconductor laser device according to the second aspect of the present invention, a different element from the impurity contained in the window region is selected as the second-conductive-type impurity contained in the second-conductive-type cladding layer so that the diffusion rate of the second-conductive-type impurity in the second-conductive-type cladding layer becomes smaller than the diffusion rate of the impurity contained in the window region in the second-conductive-type cladding layer. Thus, the second-conductive-type impurity contained in the second-conductive-type cladding layer can be prevented from passing through the second-conductive-type cladding layer and being diffused in the active layer, so that the concentration of the second-conductive-type impurity contained in the second-conductive-type cladding layer can be increased.

Accordingly, in the semiconductor laser device according to the second aspect of the present invention, a reactive current generated in the active layer can be reduced, so that heat saturation can be prevented in the active layer. Therefore, a semiconductor laser device capable of high output power operation can be provided.

In the semiconductor laser device according to the second aspect of the present invention, it is preferable that the active layer is a layer containing AlGaAs, the second-conductive-type cladding layer is a layer containing AlGaInP, and the lattice constant of the second-conductive-type cladding layer is smaller than a lattice constant of the substrate.

Thus, an adjustment can be made, based on the diffusion rate of the impurity (i.e., Zn) contained in the window region in the active layer (i.e., an infrared laser active layer) of AlGaAs, so that the lattice constant of the second-conductive-type cladding layer (i.e., a second-conductive-type infrared laser cladding layer) becomes smaller than the lattice constant of the substrate. Accordingly, Zn diffusion in the second-conductive-type infrared laser cladding layer can be facilitated.

Therefore, in the semiconductor laser device according to the second aspect of the present invention, a proper amount (e.g., $2 \times 10^{18}$ cm$^{-3}$ or more) of Zn for achieving the function as a window structure is diffused in a simple manner in the part of the infrared laser active layer located in the vicinity of the light emitting edge surface, so that an infrared laser active layer having an excellent window region in the vicinity of a light emitting edge surface can be realized.

Furthermore, in the semiconductor laser device according to the second aspect of the present invention, a different element from Zn is selected as the second-conductive-type impurity contained in the second-conductive-type infrared laser cladding layer so that the diffusion rate of the second-conductive-type impurity in the second-conductive-type infrared laser cladding layer becomes smaller than the diffusion rate of the impurity (i.e., Zn) contained in the window region in the second-conductive-type infrared laser cladding layer. Thus, the second-conductive-type impurity contained in the second conductive-type infrared laser cladding layer can be prevented from passing the second-conductive-type infrared laser cladding layer and being diffused in the infrared laser active layer, so that the concentration of he second-conductive-type impurity contained in the second-conductive-type infrared laser cladding layer can be increased.

Accordingly, in the semiconductor laser device according to the second aspect of the present invention, a reactive current generated in the infrared laser active layer can be reduced, so that heat saturation can be prevented in the infrared laser active layer. Therefore, a semiconductor laser device capable of high output power operation can be provided.

In the semiconductor laser device according to the second aspect of the present invention, it is preferable that the impurity contained in the window region contains Zn.

In the semiconductor laser device according to the second aspect of the present invention, it is preferable that the second-conductive-type impurity contains Mg.

Thus, the diffusion rate of the second-conductive-type impurity (i.e., Mg) in the second-conductive-type infrared laser cladding layer becomes smaller than the Zn diffusion rate in the second-conductive-type infrared laser cladding layer, so that the concentration of the second-conductive-type impurity, i.e., Mg contained in the second-conductive-type infrared laser cladding layer can be increased.

In the semiconductor laser device according to the second aspect of the present invention, it is preferable that a concentration of the second-conductive-type impurity contained in the second-conductive-type cladding layer is $6 \times 10^{17}$ cm$^{-3}$ or more and $1.6 \times 10^{18}$ cm$^{-3}$ or less.

Thus, the concentration of the second-conductive-type impurity (e.g., Mg) contained in the second-conductive-type infrared laser cladding layer can be increased.

In the semiconductor laser device according to the second aspect of the present invention, it is preferable that the active layer has a quantum well structure.

As has been described, according to a semiconductor laser device of the first aspect of the present invention and a method for fabricating the semiconductor laser device, a lattice constant of the first second-conductive-type cladding layer and a lattice constant of a second second-conductive-type cladding layer are adjusted, so that a proper amount of an impurity for achieving the function as a window structure in part of a first active layer located in the vicinity of a light emitting edge surface and part of a second active layer located in the vicinity of the light emitting edge surface by a single impurity diffusion step. Therefore, the first active layer having an excellent first window region in the part thereof located in the vicinity of the light emitting edge surface can be realized and the second active layer having an excellent second window region in the part thereof located in the vicinity of the light emitting edge surface can be realized.

In this manner, according to the semiconductor laser device of the first aspect of the present invention and the method for fabricating the semiconductor laser device, excellent first and second window regions can be formed, so that the generation of optical damages can be prevented in the part of the first active layer located in the vicinity of the light emitting edge surface and the part of the second active layer located in the vicinity of the light emitting edge surface. Therefore, a semiconductor laser device capable of high output power operation can be provided.

Furthermore, according to the semiconductor laser device of the first aspect of the present invention and the method for fabricating the semiconductor laser device, the first and second window regions can be formed by a single impurity diffusion step. Therefore, improvement of a yield of a semiconductor laser device and reduction in fabrication cost can be achieved.

DESCRIPTION OF THE PREFERRED EMBODIMENTS

Figure 1A:
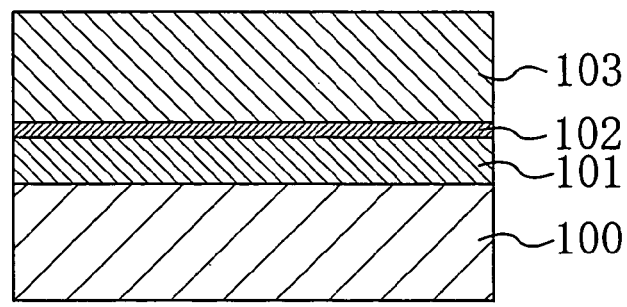
FIGS. 1A through 1D are cross-sectional views of main part of a semiconductor laser device, illustrating respective steps for fabricating the semiconductor laser device according to a first embodiment of the present invention.

Hereafter, embodiments of the present invention will be described with reference to the accompanying drawings.

First Embodiment

A method for fabricating a semiconductor laser device according to a first embodiment of the present invention will be hereafter described with reference to FIGS. 1A through 1D, FIGS. 2A and 2B, and FIGS. 3A through 3D.

FIGS. 1A through 1D, FIGS. 2A and 2B and FIGS. 3A through 3D are views illustrating respective steps for fabricating a semiconductor laser device according to the first embodiment of the present invention, and in the drawings, main part of the semiconductor laser device are shown.

Figure 2A:
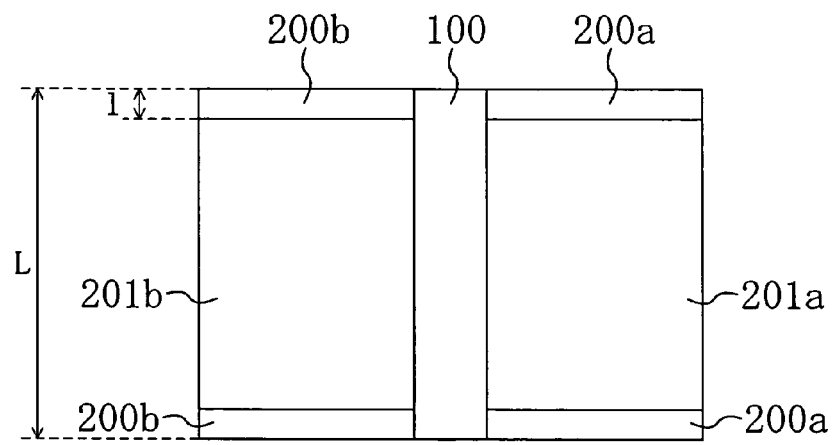
FIGS. 2A and 2B are views of the main part of the semiconductor laser device, illustrating respective steps for fabricating the semiconductor laser device according to the first embodiment of the present invention.
Figure 2B:
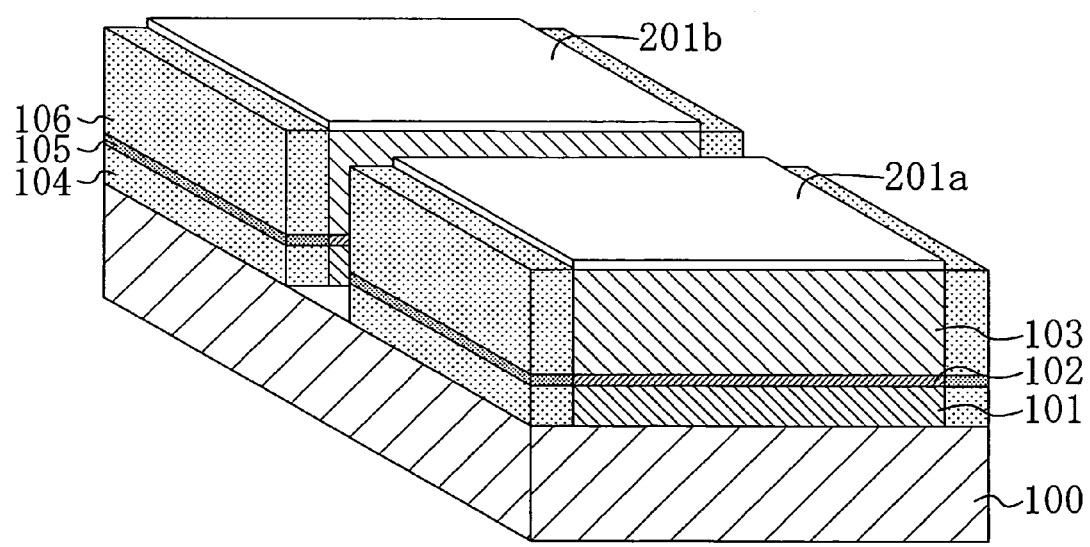
Figure 3A:
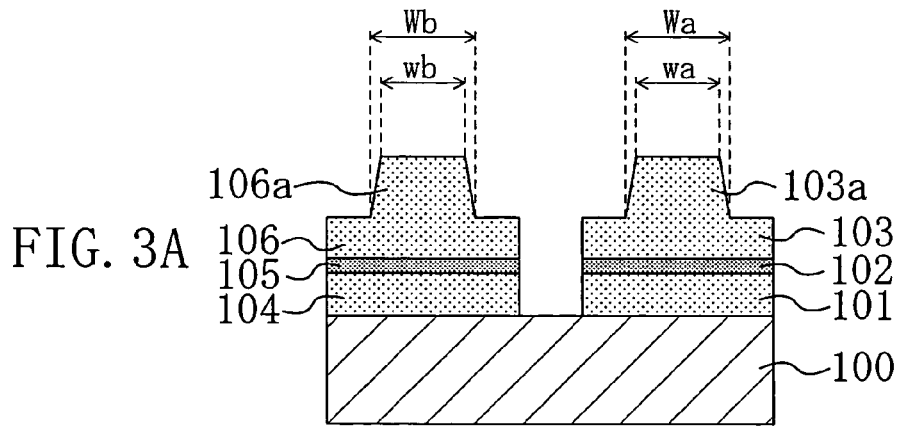
FIGS. 3A through 3D are cross-sectional views of the main part of the semiconductor laser device, illustrating respective steps for fabricating the semiconductor laser device according to the first embodiment of the present invention.
Figure 3B:
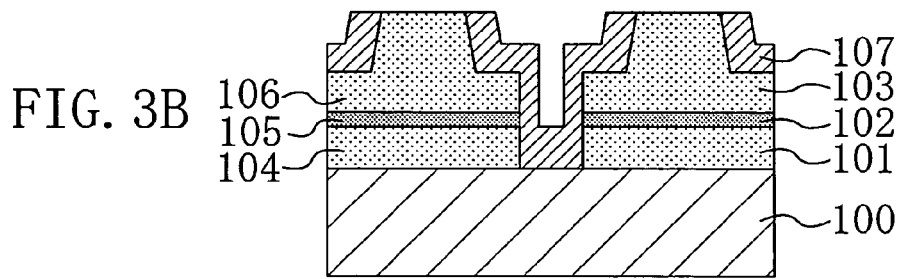
Figure 3C:
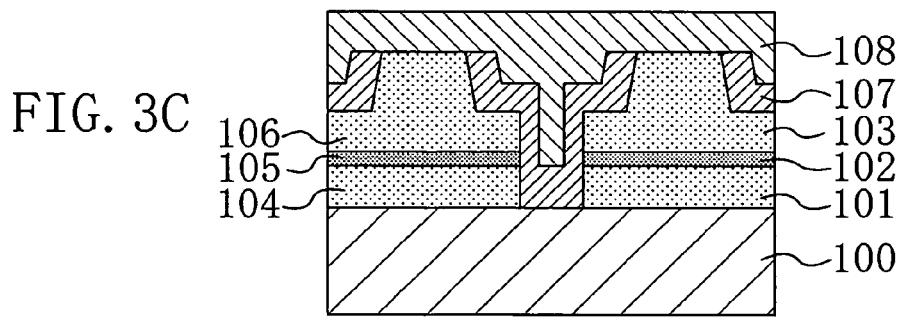
Figure 3D:
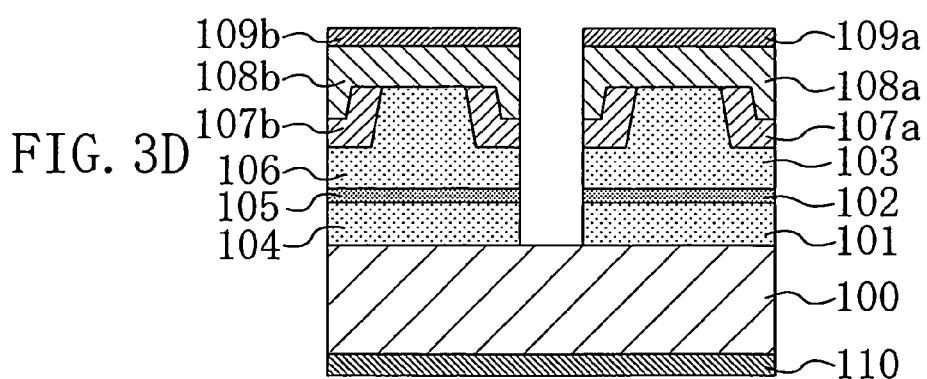
Figure 4:
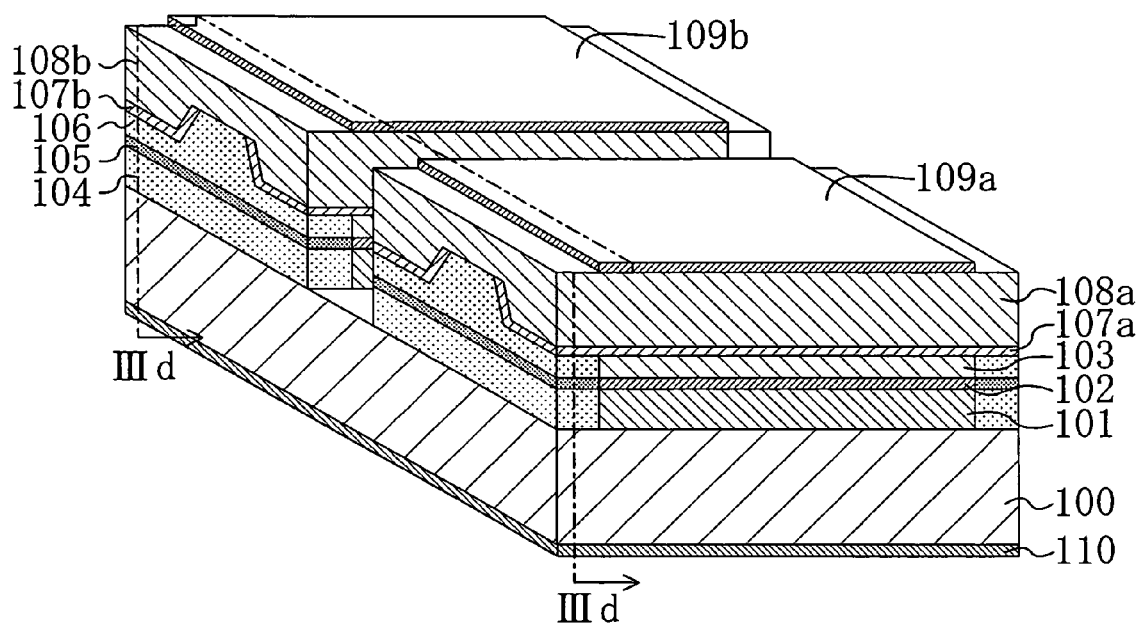
FIG. 4 is a schematic view illustrating a structure of a semiconductor laser device according to the first embodiment of the present invention.

FIGS. 1A through 1D and FIGS. 3A through 3D are cross-sectional views of the main part of the semiconductor laser device, illustrating respective steps for fabricating the semiconductor laser device, and more specifically are cross-sectional view taken along the line IIId-IIId of FIG. 4. FIG. 2A is a plan view of the main part of the semiconductor laser device, illustrating respective steps for fabricating the semiconductor laser device. FIG. 2B is a schematic view of the main part of the semiconductor laser device, illustrating respective steps for fabricating the semiconductor laser device.

First, as shown in FIG. 1A, an infrared laser n-type cladding layer 101, an infrared laser active layer 102 having a quantum well structure and an infrared laser p-type cladding layer 103 are formed in this order a substrate 100 by metal organic chemical vapor deposition (MOCVD).

In this process step, conditions for formation of the infrared laser semiconductor layers 101 though 103 by MOCVD are adjusted, thereby controlling a lattice constant of the infrared laser p-type cladding layer 103 in a simple manner and with high accuracy. Specifically, a lattice mismatch value of the infrared laser p-type cladding layer 103 to the substrate 100 is set so as to satisfy a range of $-2.0 \times 10^{-3} \pm 0.5 \times 10^{-3}$.

Figure 1B:
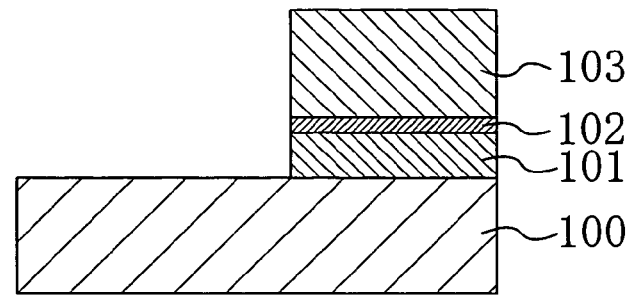

Next, as shown in FIG. 1B, parts of the infrared laser semiconductor layers 101 through 103 desired to be removed are selectively removed to expose part of the substrate 100.

Figure 1C:
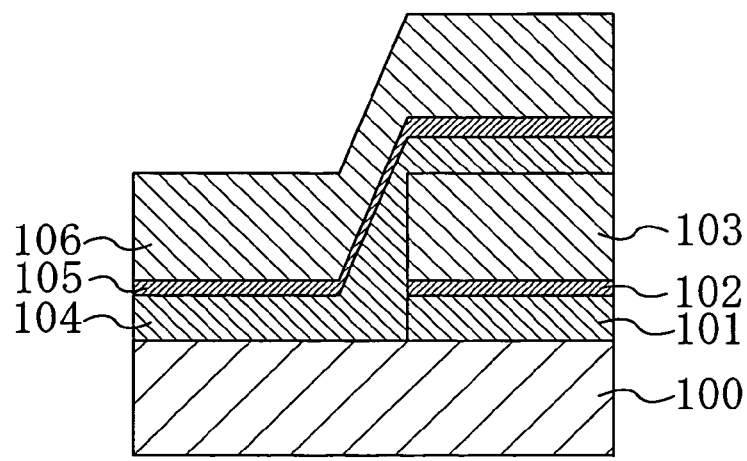

Next, as shown in FIG. 1C, a red laser n-type cladding layer 104, a red laser active layer 105 having a quantum well structure and a red laser p-type cladding layer 106 are formed in this order upwardly over the substrate by MOCVD so as to cover the exposed part of the substrate 100 and the infrared laser semiconductor layers 101 through 103.

In this process step, conditions for formation of the red laser semiconductor layers 104 though 106 by MOCVD are adjusted, thereby controlling a lattice constant of the red laser p-type cladding layer 106 in a simple manner and with high accuracy. Specifically, a lattice mismatch value of the red laser p-type cladding layer 106 to the substrate 100 is set so as to satisfy a range of $0 \pm 0.5 \times 10^{-3}$.

Thus, in the method for fabricating the semiconductor laser device according to the first embodiment of the present invention, the lattice mismatch value of the infrared laser p-type cladding layer 103 to the substrate 100 is set to be smaller than 0 and also smaller than the lattice mismatch value of the red laser p-type cladding layer 106 to the substrate 100. In this case, a lattice mismatch value of a p-type cladding layer 103 or 106 to the substrate 100 is a numerical value obtained using an equation of $\mu \times (a1-a0)/a0$ where a lattice constant of the substrate 100 is expressed by a0, a lattice constant of the p-type cladding layer 103 or 106 is expressed by a1 and the Poisson's ratio for the p-type cladding layer 103 or 106 is expressed by $\mu$. These values can be obtained from actual measurement in a simple manner using an X ray diffraction device.

Figure 1D:
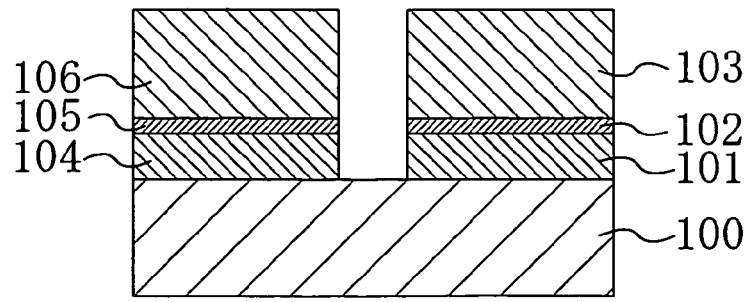

Next, as shown in FIG. 1D, parts of the red laser n-type cladding layer 104, the red laser active layer 105 and the red laser p-type cladding layer 106 located on upper and side surfaces of the infrared laser semiconductor layers 101 through 103 are selectively removed.

Next, as shown in FIG. 2A, for example, an insulation film 201a of $SiO_2$ is formed on part of the infrared laser p-type cladding layer 103 located in other part thereof than a light emitting edge surface vicinity region 200a and also, for example, an insulation film 201b of $SiO_2$ is formed on part of the red laser p-type cladding layer 106 located in other part thereof than a light emitting edge surface vicinity region 200b. In this case, a length I of each of the light emitting edge surface vicinity regions 200a and 200b in the resonance direction is 20 μm and a length L of the entire semiconductor laser device in the resonance direction is 1300 μm.

Next, as shown in FIG. 2B, using the insulation films 201a and 201b as a mask, the substrate is heated at a temperature of 600° C. for 120 minutes in a nitrogen atmosphere, thereby having Zn diffused in part of the infrared laser active layer 102 located in the vicinity of a light emitting edge surface (this vicinity area will be hereafter referred to be as a "light emitting edge surface vicinity region") and part of the red laser active layer 105 located in a light emitting edge surface vicinity region.

Thus, each of the parts of the infrared laser active layer 102 and the red laser active layer 105 located in the respective light emitting edge surface vicinity regions is disordered, thereby increasing a bandgap in each of the parts. In this manner, an infrared laser window region is formed in parts of the infrared laser semiconductor layers 101 through 103 located in the light emitting edge surface vicinity region and a red laser window region is formed in parts of the red laser semiconductor layers 104 through 106 located in the light emitting edge surface vicinity region.

Next, as shown in FIG. 3A, after removal of the insulation films 201a and 201b, part of the infrared laser p-type cladding layer 103 desired to be removed is selectively etched, thereby forming a ridge 103a so as to have a stripe shape, and part of the red laser p-type cladding layer 106 desired to be removed is selectively etched, thereby forming a ridge 106a so as to have a stripe shape. In this case, each of the ridges 103a and 106a has a cross section having a mesa (platform) shape. A width wa or wb of an upper side of the cross section of each ridge is 1 μm and a width Wa or Wb of a lower side of the cross section of each ridge is 3 μm.

Next, as shown in FIG. 3B, a semiconductor layer is grown again over the substrate 100 by selective epitaxial growth so as to cover the substrate 100 except for respective upper surfaces of the ridge 103a of the infrared laser p-type cladding layer 103 and the ridge 106a of the red laser p-type cladding layer 106. Thus, a current block layer 107 is formed over the substrate 100 so as to expose the upper surfaces of the ridge 103a and the ridge 106a.

Next, as shown in FIG. 3C, a semiconductor layer is epitaxially grown again over the infrared laser p-type cladding layer 103, the red laser p-type cladding layer 106 and the current block layer 107. Thus, a contact layer 108 is formed so as to cover the upper surfaces of the ridge 103a of the infrared laser p-type cladding layer 103 and the ridge 106a of the red laser p-type active layer 106.

Next, as shown in FIG. 3D, parts of the contact layer 108 and the current block layer 107 located in the vicinity of a boundary between the infrared laser semiconductor layers 101 through 103 and the red laser semiconductor layers 104 through 106 are etched.

Thus, parts of the current block layer 107 and the contact layer 108 located in other part thereof than an infrared laser device formation region and a red laser device formation region are selectively removed.

As described above, an isolation is provided between the infrared laser and the red laser, so that a current block layer 107a and a contact layer 108a provided over the infrared laser p-type cladding layer 103 and a current block layer 107b and a contact layer 108b provided over the red laser cladding layer 106 are obtained.

Subsequently, as shown in FIG. 3D, by vapor deposition, an infrared laser p-side electrode 109a is formed on part of the contact layer 108a located in other part thereof than the light emitting edge surface vicinity region (see 200a of FIG. 2A) and a red laser p-side electrode 109b is formed on part of the contact layer 108b located in other part thereof than the light emitting edge surface vicinity region (see 200b of FIG. 2A).

Subsequently, as shown in FIG. 3D, by vapor deposition, an n-side electrode 110 is formed on a surface of the substrate 100 located in the opposite side to a surface thereof on which the infrared laser n-type cladding layer 101 and the red laser n-type cladding layer 104 are formed.

In the above-described manner, the semiconductor laser device according to the first embodiment of the present invention is fabricated.

Hereafter, a semiconductor laser device according to the first embodiment of the present invention will be described with reference to Table 1 and FIG. 4.

Table 1 shows materials, conductive types, film thicknesses and carrier concentrations for a substrate and semiconductor layers in the semiconductor laser device of the first embodiment of the present invention.

FIG. 4 is a schematic view illustrating a structure of the semiconductor laser device according to the first embodiment of the present invention.

Materials, conductive types, film thicknesses and carrier concentrations of a substrate and semiconductor layers in the semiconductor laser device according to the first embodiment of the present invention are shown in Table 1.

That is, in the semiconductor laser device according to the first embodiment of the present invention, an adjustment is made so that the lattice mismatch value of the infrared laser p-type cladding layer 103 to the substrate 100 is smaller than 0 and also smaller than the lattice mismatch value of the red laser p-type cladding layer 106 to the substrate 100.

Hereafter, the relationship between lattice mismatch value and Zn diffusion rate for a p-type cladding layer of AlGaInP will be described with reference to FIG. 5.

Figure 5:
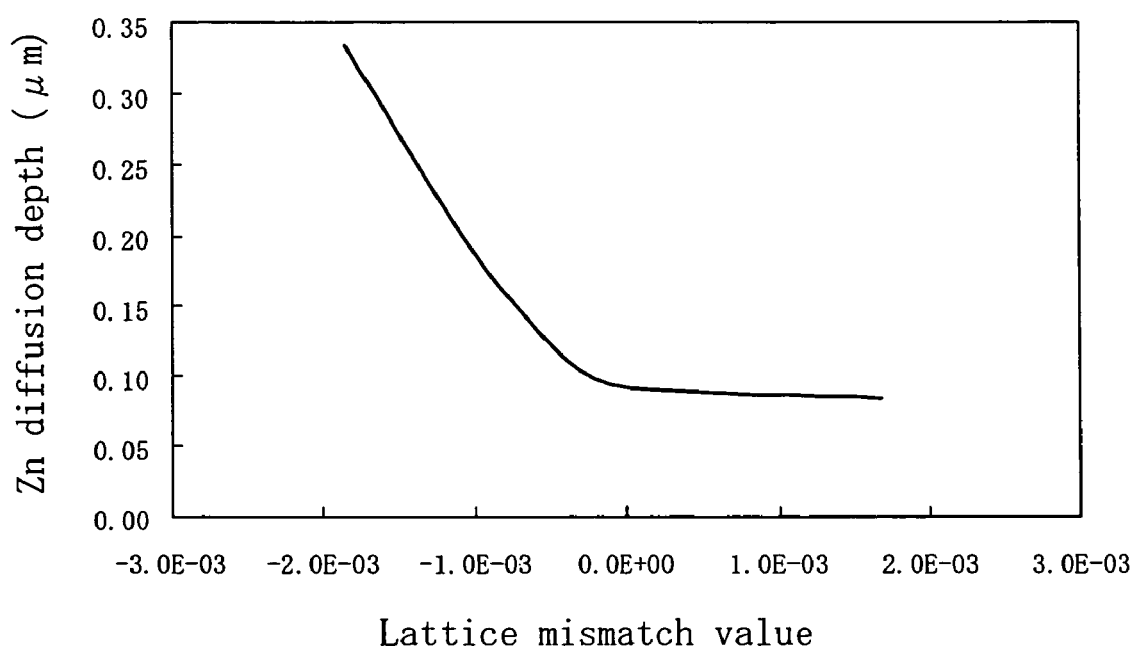
FIG. 5 is a graph showing the correlation between lattice mismatch value and Zn diffusion depth for a p-type cladding layer of AlGaInP.

FIG. 5 is a graph showing the correlation between lattice mismatch value and Zn diffusion depth for a p-type cladding layer of AlGaInP.

Specifically, under constant conditions (where heating is performed at a temperature of 600° C. for 120 minutes in a nitrogen atmosphere) of Zn diffusion, while changing the lattice mismatch value of the p-type cladding layer of

TABLE 1

| Component names | Materials | Conductive type | Film thickness | Carrier concentration |
|---|---|---|---|---|
| Substrate 100 | GaAs:Si | N | | $1 \times 10^{18}$ cm$^{-3}$ |
| Infrared laser n-type cladding layer 101 | $(Al_{0.7}Ga_{0.3})_y In_{1-y}P$:Si | N | 2.0 μm | $1 \times 10^{18}$ cm$^{-3}$ |
| Infrared laser active layer 102 | GaAs/$Al_{0.4}Ga_{0.6}$As quantum well | | | |
| Infrared laser p-type cladding layer 103 | $(Al_{0.7}Ga_{0.3})_y In_{1-y}P$:Zn | P | 1.4 μm/0.2 μm | $5 \times 10^{17}$ cm$^{-3}$ |
| Red laser n-type cladding layer 104 | $(Al_{0.7}Ga_{0.3})_u In_{1-u}P$:Si | N | 2.0 μm | $1 \times 10^{18}$ cm$^{-3}$ |
| Red laser active layer 105 | $Ga_{0.45}In_{0.55}P/(Al_{0.5}Ga_{0.5})_{0.5}In_{0.5}P$ quantum well | | | |
| Red laser p-type cladding layer 106 | $(Al_{0.7}Ga_{0.3})_u In_{1-u}P$:Zn | P | 1.4 μm/0.2 μm | $3 \times 10^{17}$ cm$^{-3}$ |
| Current block layers 107a and 107b | $Al_{0.5}In_{0.5}P$:Si | N | 0.35 μm | $1 \times 10^{18}$ cm$^{-3}$ |
| Contact layers 108a and 108b | GaAs:Zn | P | 2.5 μm | $1 \times 10^{19}$ cm$^{-3}$ |

Note that for an infrared laser p-type cladding layer 103, the film thickness of 1.4 μm is a thickness of a ridge 103a in the infrared laser p-type cladding layer 103 and the film thickness of 0.2 μm is a thickness of other part of the infrared laser p-type cladding layer 103 than the ridge 103a.

Likewise, for a red laser p-type cladding layer 106, the film thickness of 1.4 μm is a thickness of a ridge 106a in the red laser p-type cladding layer 106 and the film thickness of 0.2 μm is a thickness of other part of the red laser p-type cladding layer 106 than the ridge 106a.

It should be also noted that a thickness of each of current block layers 107a and 107b is a thickness of part of each of the current block layers 107a and 107b which has been grown in the perpendicular direction to a substrate 100.

In the semiconductor laser device according to the first embodiment of the present invention, a material expressed by $(Al_{0.7}Ga_{0.3})_y In_{1-y}P$: Zn is used for the infrared laser p-type cladding layer 103, and in $(Al_{0.7}Ga_{0.3})_y In_{1-y}P$: Zn, y is set so that a lattice mismatch value of the infrared laser p-type cladding layer 103 to the substrate 100 satisfies $-2.0 \times 10^{-3} \pm 0.5 \times 10^{-3}$.

The red laser p-type cladding layer 106 is formed of a material expressed by $(Al_{0.7}Ga_{0.3})_u In_{1-u}P$: Zn, and in $(Al0.7Ga_{0.3})_u In_{1-u}P$: Zn, u is set so that a lattice mismatch value of the red laser p-type cladding layer 106 to the substrate 100 satisfies $0 \pm 0.5 \times 10^{-3}$.

Thus, in the semiconductor laser device according to the first embodiment of the present invention, an adjustment is made so that the lattice mismatch value of the infrared laser p-type cladding layer 103 to the substrate 100 becomes within the range from $-3.0 \times 10^{-3}$ or more to less than $-5.0 \times 10^{-4}$. The lattice mismatch value of the red laser p-type cladding layer 106 to the substrate 100 is adjusted to be within the range from $-5.0 \times 10^{-4}$ or more to $2.0 \times 10^{-3}$ or less.

AlGaInP, Zn diffusion was performed to the p-type cladding layer. Then, a Zn diffusion depth in the p-type cladding layer was measured.

In FIG. 5, the abscissa indicates the lattice mismatch value for the p-type cladding layer and the lattice mismatch value is denoted using E. For example, $-3.0E-03$ is $-3.0 \times 10^{-3}$.

In FIG. 5, the ordinate is obtained by platting with a surface of the p-type cladding layer into which Zn is implanted assumed to be a reference, i.e., 0 μm and indicates a distance along the depth direction of the p-type cladding layer in which Zn is diffused from a surface as a reference, i.e., the Zn diffusion depth μm in the p-type cladding layer.

As shown in FIG. 5, when the lattice mismatch value of the p-type cladding layer is 0 or more (specifically, from 0.0E+00 to about 1.7E–03), the Zn diffusion depth does not depend on the lattice cladding value of the p-type cladding layer and is substantially constant (specifically, about 0.1 μm).

As described above, when the lattice mismatch value of the p-type cladding layer is 0 or more, i.e., a compressive stress is applied to the p-type cladding layer, the Zn diffusion rate is substantially constant and hardly depends on the lattice mismatch value of the p-type cladding layer.

Also, as shown in FIG. 5, when the lattice mismatch value of the p-type cladding layer is 0 or less (specifically, from $-2.0E-03$ to 0.00E+00), the Zn diffusion depth is increased substantially at a constant rate, as the lattice mismatch value of the p-type cladding layer is reduced.

For example, as shown in FIG. 5, when the lattice mismatch value of the p-type cladding layer is 0 (i.e., 0.0E+00), the Zn diffusion depth is about 0.1 μm. In contrast, when the lattice mismatch value of the p-type cladding layer is $-2.0 \times 10^{-3}$ (i.e., $-2.0E-0.3$), the Zn diffusion depth is about 0.3 μm. As the lattice mismatch value of the p-type cladding layer is changed from 0 to $-2.0\times10^{-3}$, the Zn diffusion depth is changed from 0.1 µm to 0.3 µm.

In this manner, when the lattice mismatch value of the p-type cladding layer is 0 or less, i.e., a tensile stress is applied to the p-type cladding layer, the Zn diffusion rate is increased substantially at a constant rate as the lattice mismatch value of the p-type cladding layer is reduced.

According to the present invention, an adjustment is made so that the lattice mismatch value of the infrared laser cladding layer 103 formed of $(Al_{0.7}Ga_{0.3})_yIn_{1-y}P$ is smaller than 0 and also smaller than the lattice mismatch value of the red laser p-type cladding layer 106 formed of $(Al_{0.7}Ga_{0.3})_uIn_{1-u}P$. Thus, the Zn diffusion rate in the infrared laser p-type cladding layer 103 can be adjusted to be larger than the Zn diffusion rate in the red laser p-type cladding layer 106.

For the purpose of clearly describing effects of the present invention, the following measurements were performed for a known semiconductor laser device and the semiconductor laser device of the present invention.

Note that description will be made using as a specific example the case where in the known semiconductor laser device for which the measurements have been performed, conditions for a Zn diffusion step were adjusted so that a necessary amount of Zn for achieving the function of a window structure could be diffused, and an infrared laser window region and a red laser window region were formed by a single Zn diffusion step.

First, secondary ion mass spectroscopy (SIMS) is performed to the known semiconductor laser device and the semiconductor laser device of the present invention to evaluate the semiconductor laser devices.

Hereafter, measurement results of SIMS will be described with reference to FIG. 6 and FIG. 7.

Figure 6:
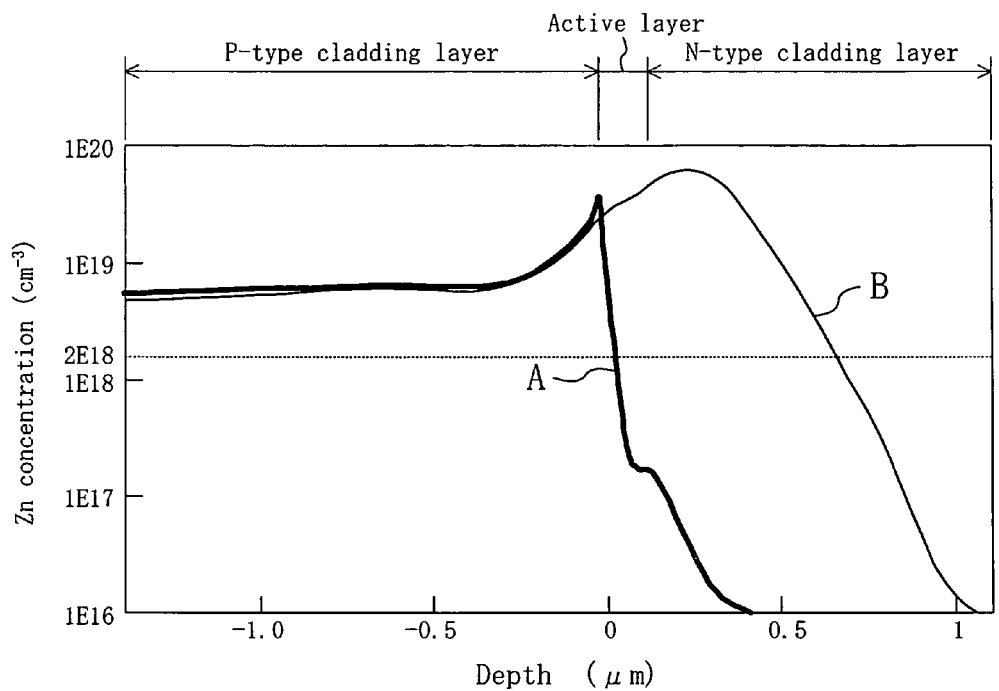
FIG. 6 is a graph showing measurement results of SIMS for window regions in a known semiconductor laser device.

FIG. 6 is a graph showing measurement results of SIMS for window regions in the known semiconductor laser device.

Figure 7:
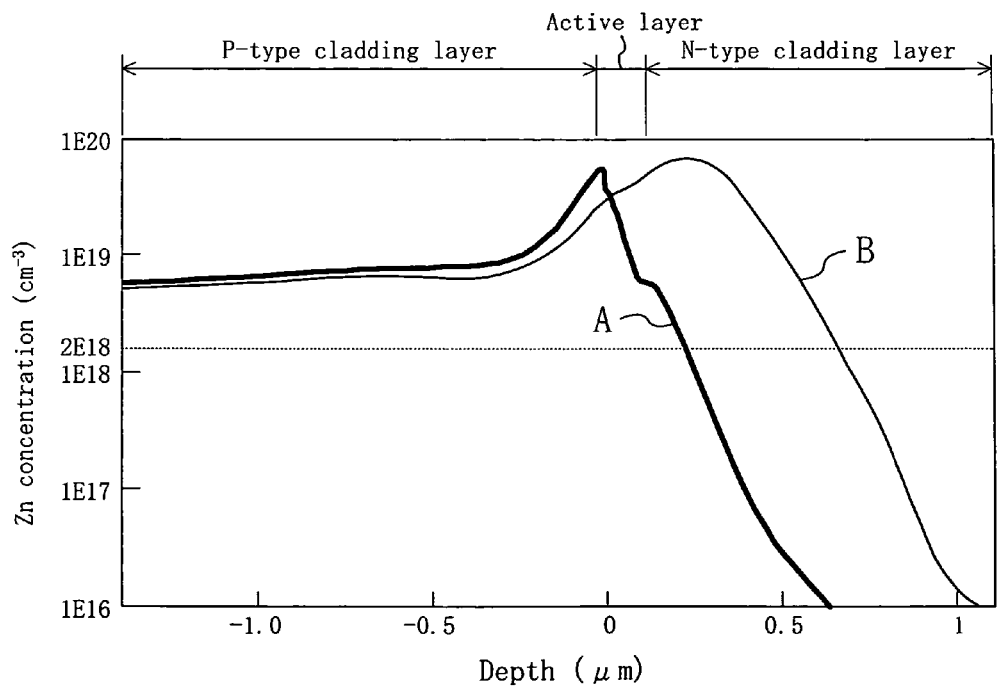
FIG. 7 is a graph showing measurement results of SIMS for window regions in a semiconductor laser device according to the present invention.

FIG. 7 is a graph showing measurement results of SIMS for window regions in the semiconductor laser device of the present invention.

A spectrum A shown in each of FIG. 6 and FIG. 7 shows measurement results of SIMS in an infrared laser window region and a spectrum B shown in each of FIG. 6 and FIG. 7 shows measurement results of SIMS in a red laser window region.

Moreover, the abscissa of each of the FIG. 6 and FIG. 7 indicates a depth [µm] for each semiconductor layer. Specifically, in FIG. 6 and FIG. 7, for the infrared laser (see the spectrum A), a surface of the infrared laser on which an infrared laser p-type cladding layer in an infrared laser active layer is formed is assumed to be a reference, i.e., 0 µm and a distance from the surface as a reference to each of semiconductor layers in the depth direction is shown.

In the same manner, the abscissa of each of the FIG. 6 and FIG. 7 indicates a depth [µm] for each semiconductor layer. Specifically, in FIG. 6 and FIG. 7, for the red laser (see the spectrum B), a surface of the red laser on which a red laser p-type cladding layer in a red laser active layer is formed is assumed to be a reference, i.e., 0 µm and distance from the surface as a reference to each of the semiconductor layers in the depth direction is shown.

In this case, as shown in FIG. 6 and FIG. 7, the semiconductor layers mean to be a p-type cladding layer and an n-type cladding layer. Specifically, for the infrared laser (see the spectrum A), the semiconductor layer means to be parts of an infrared laser p-type cladding layer, an infrared laser active layer and an infrared laser n-type cladding layer in which Zn is diffused to be a window region. In the same manner, for the red laser (see the spectrum B), the semiconductor layer mean to be parts of a red laser p-type cladding layer, a red laser active layer and a red laser n-type cladding layer in which Zn is diffused to be a window region.

SIMS measurement results for the known semiconductor laser device will be hereafter described.

In the known semiconductor laser device, a lattice mismatch value of the infrared laser p-type cladding layer and a lattice mismatch value of the red laser p-type cladding layer are the same. Accordingly, as shown in FIG. 6, part of the semiconductor laser device located in any p-type cladding layer shows substantially the same spectrum.

However, as has been described above, a Zn diffusion rate in an infrared laser active layer of AlGaAs mixed crystal is much smaller than a Zn diffusion rate in a red laser active layer of AlGaInP mixed crystal.

Therefore, as shown in FIG. 6, considering active layer parts of the semiconductor laser device, the concentration of Zn diffused in the infrared laser active layer is drastically reduced in the infrared laser (see the spectrum A) whereas in the red laser (see the spectrum B), the concentration of Zn diffused in the red laser active layer is not drastically reduced and a sufficient amount of Zn is diffused.

Specifically, as shown in FIG. 6, considering active layers, the concentration of Zn diffused in the infrared laser active layer is drastically reduced as the depth becomes greater to finally reach about $10^{17}$ cm$^{-3}$ in the infrared laser (see the spectrum A) whereas in the red laser (see the spectrum B), the concentration of Zn diffused in the red laser active layer is increased as the depth becomes greater and the Zn concentration in the red laser active layer is about $5\times10^{19}$ cm$^{-3}$.

To achieve an active layer having an excellent window region in a light emitting edge surface vicinity region, Zn is diffused into part of the active layer located in a light emitting edge surface vicinity region at a proper amount (specifically, $2\times10^{18}$ cm$^{-3}$) for achieving the function as a window structure to expand a bandgap by disordering the region of the active layer in which Zn is diffused. For this reason, the condition where the Zn concentration in the window region of the active layer is a concentration of 2E18 cm$^{-3}$, i.e., $2\times10^{18}$ cm$^{-3}$ or more has to be satisfied.

In the known semiconductor laser device, as shown in FIG. 6, in the red laser (see the spectrum B), the concentration of Zn diffused in the red laser active layer is about $5\times10^{19}$ cm$^{-3}$, which satisfies the condition for the Zn concentration, i.e., a Zn condition of $2\times10^{18}$ cm$^{-3}$ or more. In contrast, in the infrared laser (see the spectrum A), the concentration of Zn diffused in the infrared laser active layer is drastically reduced to about $10^{17}$ cm$^{-3}$, which does not satisfies the condition for the Zn concentration, i.e., a Zn condition of $2\times10^{18}$ cm$^{-3}$ or more.

As has been described, in the known semiconductor laser device, a proper amount of Zn for achieving the function as a window structure is diffused in the red laser active layer in the red laser whereas a proper amount of Zn for achieving the function as a window structure is not diffused in the infrared laser active layer in the infrared laser.

SIMS results for the semiconductor laser device of the present invention will be herein described.

In the semiconductor laser device of the present invention, an adjustment is made so that a lattice mismatch value of the infrared laser p-type cladding layer is smaller than 0 and also smaller than a lattice mismatch value of the red laser p-type cladding layer. Accordingly, an adjustment is made so that a Zn diffusion rate in the infrared laser p-type cladding layer becomes larger than a Zn diffusion speed in the red laser p-type cladding layer. Thus, as shown in FIG. 7, in p-type cladding layer regions, the Zn concentration is increased, as the depth is greater, so that the Zn concentration in the infrared laser p-type cladding layer is larger than the Zn concentration of the red laser p-type cladding layer.

As described above, in the semiconductor laser device of the present invention, adjustment is made so that the Zn diffusion rate in the infrared laser p-type cladding layer is larger than the Zn diffusion rate in the red laser p-type cladding layer. Accordingly, doses of Zn diffused in the infrared and red laser active layers are adjusted such that an effective dose of Zn diffused in the infrared laser active layer through the infrared laser p-type cladding layer is larger than an effective dose of Zn diffused in the red laser active layer through the red laser p-type cladding layer.

Therefore, in the semiconductor laser device of the present invention, as shown in FIG. 7, in active layer part, even though the concentration of Zn diffused in the infrared laser active layer is drastically reduced, the concentration of Zn diffused in the infrared laser active layer satisfies the Zn concentration condition, i.e., $2 \times 10^{18}$ cm$^{-3}$ and, from this fact, it has been confirmed that a proper amount of Zn for achieving the function as a window structure is diffused in the infrared laser active layer.

Next, evaluation of the known semiconductor laser device and the semiconductor laser device is performed by measuring their current-light output power characteristics.

Hereafter, results of measurements of current-light output power characteristics will be described, using a double wavelength laser device designed to have a light output power of 200 mW as a specific example, with reference to FIG. 8 and FIG. 9.

Figure 8:
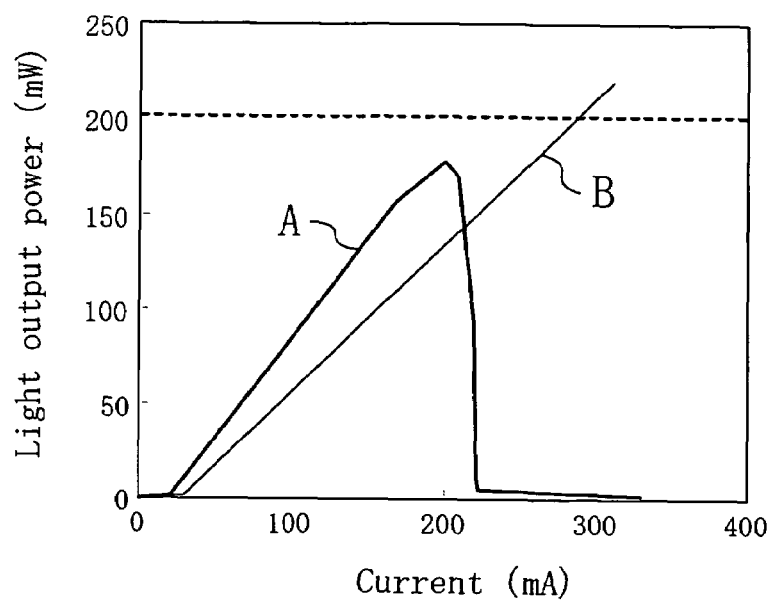
FIG. 8 is a graph showing current-light output power characteristics for the known semiconductor laser device.

FIG. 8 is a graph showing current-light output power characteristics for the known semiconductor laser device.

Figure 9:
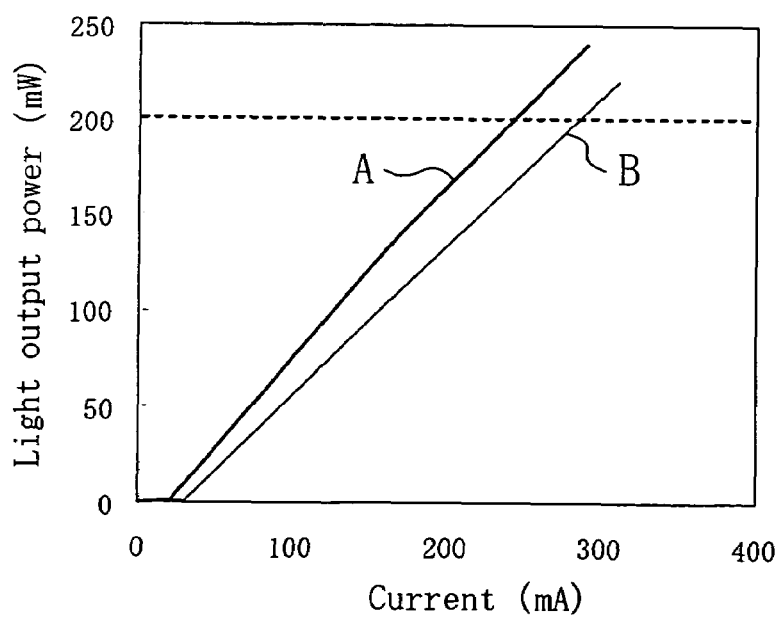
FIG. 9 is a graph showing current-light output power characteristics for a semiconductor laser device according to the present invention.

FIG. 9 is a graph showing current-light output power characteristics for the semiconductor laser device of the present invention.

A spectrum A shown in each of FIG. 8 and FIG. 9 indicates current-light output power characteristics for an infrared laser. A spectrum B shown in each of FIG. 8 and FIG. 9 indicates current-light output power characteristics for a red laser.

Hereafter, current-light output power characteristics of the known semiconductor laser device will be described.

In the known semiconductor laser device, as shown in FIG. 8, in the red laser (see the spectrum B), a light output power is increased at a constant rate as a current is increased, and the light output power has reached the design value of light output power, i.e., 200 mW around a point where the current is about 290 mA.

In contrast, in the known semiconductor laser device, as shown in FIG. 8, in the infrared laser (see the spectrum A), a light output power is increased at a constant rate as a current is increased. The value of light output power has reached about 170 mA around a point where the current is about 200 mA but the light output power abruptly drops after the current has reached about 200 mA.

Thus, in the known semiconductor laser device, as shown in FIG. 6, since a proper amount of Zn for achieving the function as a window structure is diffused in part of the red laser active layer located in a light emitting edge surface vicinity region, the generation of optical damages can be prevented in the part of the red laser active layer located in the light emitting edge surface vicinity region. Thus, in the part of the red laser active layer located in the light emitting edge surface vicinity region, the design value of light output power, i.e., 200 mW can be achieved without causing termination of a laser emission operation.

In the known semiconductor laser device, as shown in FIG. 6, since a proper amount of Zn for achieving the function as a window structure is not diffused in part of the infrared laser active layer located in a light emitting edge surface vicinity region, optical damages are generated so that a laser emission operation is terminated. Therefore, the design value of light output power, i.e., 200 mW can not be achieved.

Hereafter, current-light output power characteristics of the semiconductor laser device of the present invention will be described.

In the semiconductor laser device of the present invention, as shown in FIG. 9, even in the infrared laser (see the spectrum A), a light output power is increased at a constant rate as a current is increased, and the value of light output power has reached the design value of light output power, i.e., 200 mW around a point where the current is about 240 mA.

As has been described, in the semiconductor laser device of the present invention, as shown in FIG. 7, since a proper amount Zn for achieving the function as a window structure is diffused not only in the part of the red laser active layer located in the light emitting edge surface vicinity region but also in the part of the infrared laser active layer located in the light emitting edge surface vicinity region, the generation of optical damages can be prevented in the part of the infrared laser active layer located in the light emitting edge surface vicinity region. Therefore, the design value of light output power, i.e., 200 mW can be achieved without causing termination of a laser emission operation.

As has been described, with the semiconductor laser device according to the first embodiment of the present invention, for the purpose of compensating for a difference between the Zn diffusion rate in the infrared laser active layer 102 and the Zn diffusion rate in the red laser active layer 105, the lattice constant of the infrared laser p-type cladding layer 103 is adjusted so as to be smaller than the lattice constant of the substrate 100 and also smaller than the lattice constant of the red laser p-type cladding layer 106. Accordingly, an adjustment is made so that the Zn diffusion rate in the infrared laser p-type cladding layer 103 becomes larger than the Zn diffusion rate in the red laser p-type cladding layer 106.

Therefore, in the semiconductor laser device according to the first embodiment of the present invention, for the purpose of compensating for a difference between the Zn diffusion rate in the infrared laser active layer 102 and the Zn diffusion rate in the red laser active layer 105, an adjustment is made so that an effective dose for Zn to be diffused in the infrared laser active layer 102 through the infrared laser p-type cladding layer 103 becomes larger than an effective dose of Zn to be diffused in the red laser active layer 105 through the red laser p-type cladding layer 106.

In the semiconductor laser device according to the first embodiment of the present invention, a proper amount of Zn for achieving the function as a window structure is diffused in part of the infrared laser active layer 102 located in the light emitting edge surface vicinity region and part of the red laser active layer 105 located in the light emitting edge surface vicinity region (see FIG. 7) at a single Zn diffusion step. Thus, the infrared laser active layer 102 having an excellent infrared laser window region in its light emitting edge surface vicinity part can be achieved and at the same time the red laser active layer 105 having an excellent red laser window region in its light emitting edge surface vicinity part can be achieved, so that a semiconductor laser device capable of high output power operation can be provided (see FIG. 9).

The semiconductor laser device according to the first embodiment of the present invention has been described using, as a specific example, the case where as shown in Table 1, a material constituting the infrared laser p-type cladding layer 103 is $(Al_xGa_{1-x})_yIn_{1-y}P$ (Al composition ratio x=0.7) and a material constituting the red laser p-type cladding layer 106 is $(Al_tGa_{1-t})_uIn_{1-u}P$ (Al composition ratio t=0.7).

However, the present invention is not limited thereto. The Al composition ratio x in the infrared laser p-type cladding layer 103 and the Al composition ratio t in the red laser p-type cladding layer 106 may be appropriately adjusted for conveniences of design.

In general, as an Al composition in a semiconductor layer is reduced, a Zn diffusion rate in the semiconductor layer is reduced.

However, in the semiconductor laser device according to the first embodiment of the present invention, even when the composition ratio x and the composition ratio t satisfy the relationship of x<t, an adjustment can be made, by adjusting the composition ratio y and the composition ratio u, so that the Zn diffusion rate in the infrared laser p-type cladding layer 103 becomes larger than the Zn diffusion rate in the red laser p-type cladding layer 106.

Specifically, the composition ratio y and the composition ratio u are adjusted so that the lattice mismatch value of the infrared laser p-type cladding layer 103 to the substrate 100 satisfies the range from $-3.0 \times 10^{-3}$ or more to less than $-5.0 \times 10^{-4}$ and the lattice mismatch value of the red laser p-type cladding layer 106 to the substrate 100 satisfies the range from $-5.0 \times 10^{-4}$ or more to $2.0 \times 10^{-3}$ or less.

As has been described, in the semiconductor laser device according to the first embodiment of the present invention, even when the composition ratio x and the composition ratio t satisfy the relationship of x<t, the Zn diffusion rate in the infrared p-type cladding layer 103 does not become smaller than the Zn diffusion rate in the red laser p-type cladding layer 106.

By the method for fabricating a semiconductor laser device according to the first embodiment of the present invention, as shown in FIG. 1A, the lattice constant of the infrared laser p-type cladding layer 103 can be controlled with high accuracy in a simple manner in the step of forming infrared laser semiconductor layers 101 through 103 by MOCVD and, as shown in FIG. 1C, the lattice constant of the red laser p-type cladding layer 106 can be controlled with high accuracy in a simple manner in the step of forming red laser semiconductor layers 104 through 106 by MOCVD. Thus, for the purpose of compensating for a difference between the Zn diffusion rate in the infrared laser active layer 102 and the Zn diffusion rate in the red laser active layer 105, an adjustment can be made beforehand so that the lattice constant of the infrared laser p-type cladding layer 103 becomes smaller than the lattice constant of the substrate 100 and also smaller than the lattice constant of the red laser p-type cladding layer 106.

Thus, by the method for fabricating a semiconductor laser device according to the first embodiment of the present invention, since for the purpose of compensating for a difference between the Zn diffusion rate in the infrared laser active layer 102 and the diffusion rate in the red laser active layer 105, an adjustment can be made beforehand so that the Zn diffusion rate in the infrared laser p-type cladding layer 103 becomes larger than the Zn diffusion rate in the red laser p-type cladding layer 106. Accordingly, as shown in FIG. 2B, in the Zn diffusion step, an adjustment can be made so that an effective dose of Zn diffused in the infrared laser active layer 102 through the infrared laser p-type cladding layer 103 becomes larger than an effective dose of Zn diffused in the red laser active layer 105 through the red laser p-type cladding layer 106.

Therefore, in the method for fabricating a semiconductor laser device according to the first embodiment of the present invention, as shown in FIG. 7, a proper amount of Zn for achieving the function as a window structure can be diffused in part of the infrared red laser active layer 102 located in the light emitting edge surface vicinity region 200a and part of the red laser active layer 105 located in the light emitting edge surface vicinity region 200b. Thus, an excellent infrared laser window region can be formed in part of the infrared laser active layer 102 located in the light emitting edge surface vicinity region 200a and also an excellent red laser window region can be formed in part of the red laser active layer 105 located in the light emitting edge surface vicinity region 200b.

As has been described, by the method for fabricating a semiconductor laser device according to the first embodiment of the present invention, an excellent red laser widow region and an excellent red laser window region can be formed, so that the generation of optical damages can be prevented in the part of the infrared laser active layer 102 located in the light emitting edge surface vicinity region 200a and the part of the red laser active layer 105 located in the light emitting edge surface vicinity region 200b. Therefore, as shown in FIG. 9, a semiconductor laser device capable of high output power operation can be provided.

Moreover, by the method for fabricating a semiconductor laser device according to the first embodiment of the present invention, as shown in FIG. 2B, an infrared laser window region and a red laser window region can be formed in a single Zn diffusion step. Therefore, a yield of the semiconductor laser device can be improved and fabrication costs can be reduced.

Furthermore, by the method for fabricating a semiconductor laser device according to the first embodiment of the present invention, as shown in FIG. 7, a proper amount of Zn for achieving the function as a window structure can be diffused in the part of the infrared laser active layer 102 located in the light emitting edge surface vicinity region 200a and the part of the red laser active layer 105 located in the light emitting edge surface vicinity region 200b.

Therefore, by the method for fabricating a semiconductor laser device according to the first embodiment of the present invention, unlike the known example, Zn is not excessively diffused in the parts of red laser semiconductor layers 104 through 106 located in the light emitting edge surface vicinity region 200b. Thus, crystal quality in the parts of the red laser semiconductor layers 104 through 106 located in the light emitting edge surface vicinity region 200b can be prevented from being markedly degraded.

Furthermore, in the method for fabricating a semiconductor laser device according to the first embodiment of the present invention, unlike the known example, Zn excessively diffused in the part of the red laser semiconductor layers 104 through 106 located in the light emitting edge surface vicinity region 200b does not reach the substrate 100. Thus, the generation of electrical short circuit in the semiconductor laser device can be prevented.

The semiconductor laser device and the method for fabricating the semiconductor laser device according to the first embodiment of the present invention have been described using a double wavelength laser device as a specific example. However, the present invention is not limited thereto. For example, even in a monolithic integrated laser device such as a triple wavelength laser device, the same effects as those of the semiconductor laser device and the method for fabricating the semiconductor laser device according to the first embodiment of the present invention can be achieved.

Second Embodiment

To achieve a semiconductor laser device which is capable of higher speed data write operation onto a DVD-ROM or the like and includes an increased number of layers in future, a semiconductor laser device is required to have a light output power of 300 mW to 400 mW. That is, a semiconductor laser device capable of higher output power operation is required.

Therefore, a semiconductor laser device according to a second embodiment of the present invention has been devised with an object of realizing formation of an infrared laser active layer and a red laser active layer each having an excellent window region in light emitting edge surface vicinity part thereof by a single Zn diffusion step as in the semiconductor laser device according to the first embodiment of the present invention. Furthermore, another object to be achieved by the second embodiment is to provide a semiconductor laser device capable of even higher output power operation.

In this embodiment, to realize a semiconductor laser device capable of even higher output power operation, more currents have to be supplied to an active layer.

However, as a current supplied to the active layer is increased, a current (which will be hereafter referred to as a "reactive current") which does not contribute to light emission is increased. A reactive current causes heat generation and, therefore, as a reactive current generated in the active layer is increased, a temperature of the inside of the active layer is increased.

Therefore, in the active layer, light emission saturation (which will be hereafter referred to as "heat saturation") due to heat generation is caused, so that desired light emission can not be realized and a semiconductor laser device capable of high output power operation can not be achieved. Therefore, to realize a semiconductor laser device capable of high output power operation, a reactive current generated in the active layer has to be reduced.

To cope with the above-described issue, increase in concentration of an impurity contained in a p-type cladding layer can be used as means for reducing a reactive current.

By this means, a quasi-Fermi level can be shifted in the p-type cladding layer, so that an energy barrier to electrons injected from the p-type cladding layer into an active layer can be increased. Accordingly, a reactive current generated in the active layer can be reduced.

Thus, the concentration of an impurity contained in the p-type cladding layer is increased, so that a reactive current generated in the active layer can be reduced and heat saturation can be prevented. Therefore, a semiconductor laser device capable of high output power operation can be achieved.

In the semiconductor laser device according to the second embodiment of the present invention, the concentration of an impurity contained in the p-type cladding layer is increased. Thus, a semiconductor laser device capable of higher output power operation can be provided.

Hereafter, the semiconductor laser device according to the second embodiment of the present invention will be described using a double wavelength laser device capable of light emitting operation at 350 mW as a specific example.

The semiconductor laser device according to the second embodiment of the present invention includes the same components as the above-described components of the semiconductor laser device according to the first embodiment of the present invention. Therefore, the semiconductor laser device of this embodiment will be described with reference to FIG. 4. For the semiconductor laser device according to the second embodiment of the present invention, the same description as in the first embodiment of the present invention will not be repeated.

Materials, conductive types, film thicknesses and carrier concentrations for a substrate and semiconductor layers in the semiconductor laser device according to the second embodiment of the present invention are shown in Table 2.

TABLE 2

| Component names | Materials | Conductive type | Film thickness | Carrier concentration |
|---|---|---|---|---|
| Substrate 100 | GaAs:Si | N | | $1 \times 10^{18}$ cm$^{-3}$ |
| Infrared laser n-type cladding layer 101 | $(Al_{0.7}Ga_{0.3})_y In_{1-y}P$:Si | N | 2.0 μm | $1 \times 10^{18}$ cm$^{-3}$ |
| Infrared laser active layer 102 | GaAs/$Al_{0.6}Ga_{0.4}$As quantum well | | | |
| Infrared laser p-type cladding layer 103 | $(Al_{0.7}Ga_{0.3})_y In_{1-y}P$:Mg | P | 1.4 μm/0.2 μm | $1.5 \times 10^{18}$ cm$^{-3}$ |
| Red laser n-type cladding layer 104 | $(Al_{0.7}Ga_{0.3})_u In_{1-u}P$:Si | N | 2.5 μm | $1 \times 10^{18}$ cm$^{-3}$ |
| Red laser active layer 105 | $Ga_{0.45}In_{0.55}P/(Al_{0.5}Ga_{0.5})_{0.5}In_{0.5}P$ quantum well | | | |
| Red laser p-type cladding layer 106 | $(Al_{0.7}Ga_{0.3})_u In_{1-u}P$:Zn | P | 1.4 μm/0.2 μm | $1.5 \times 10^{18}$ cm$^{-3}$ |
| Current block layers 107a and 107b | $Al_{0.5}In_{0.5}P$:Si | N | 0.35 μm | $1 \times 10^{18}$ cm$^{-3}$ |
| Contact layers 108a and 108b | GaAs:Zn | P | 2.5 μm | $1 \times 10^{19}$ cm$^{-3}$ |

Note that for an infrared laser p-type cladding layer 103, the film thickness of 1.4 μm is a thickness of a ridge 103a in the infrared laser p-type cladding layer 103 and the film thickness of 0.2 μm is a thickness of other part of the infrared laser p-type cladding layer 103 than the ridge 103a.

In the same manner, for a red laser p-type cladding layer 106, the film thickness of 1.4 μm is a thickness of a ridge 106a in the red laser p-type cladding layer 106 and the film thickness of 0.2 μm is a thickness of other part of the red laser p-type cladding layer 106 than the ridge 106a.

It should be also noted that a thickness of each of current block layers 107a and 107b is a thickness of part of each of the current block layers 107a and 107b which has been grown again in the perpendicular direction to a substrate 100.

The semiconductor laser device according to the second embodiment of the present invention will be hereafter described in detail with compared to the semiconductor laser device according to the first embodiment of the present invention.

In the semiconductor laser device according to the second embodiment of the present invention, as in the semiconductor laser device according to the first embodiment of the present invention, respective lattice constants of the infrared laser p-type cladding layer 103 and the red laser p-type cladding layer 106 are adjusted so that a difference between a Zn diffusion rate in the infrared laser active layer 102 and a Zn diffusion rate in the red laser active layer 105 is compensated.

Specifically, a material expressed by $(Al_{0.7}Ga_{0.3})_yIn_{1-y}P$: Mg is used for the infrared laser p-type cladding layer 103, and in $(Al_{0.7}Ga_{0.3})_yIn_{1-y}P$: Mg, y is set so that a lattice mismatch value of the infrared laser p-type cladding layer 103 to the substrate 100 satisfies $-2.0\times10^{-3}\pm0.5\times10^{-3}$.

The red laser p-type cladding layer 106 is formed of a material expressed by $(Al_{0.7}Ga_{0.3})_uIn_{1-u}P$: Zn, and in $(Al_{0.7}Ga_{0.3})_uIn_{1-u}P$: Zn, u is set so that a lattice mismatch value of the red laser p-type cladding layer 106 to the substrate 100 satisfies $0\pm0.5\times10^{-3}$.

Thus, in the semiconductor laser device according to the second embodiment of the present invention, as in the semiconductor laser device according to the first embodiment of the present invention, an adjustment is made so that the lattice mismatch value of the infrared laser p-type cladding layer 103 to the substrate 100 becomes smaller than 0 and also smaller than the lattice mismatch value of the red laser p-type cladding layer 106 to the substrate 100.

Thus, in the semiconductor laser device according to the second embodiment of the present invention, as in the semiconductor laser device according to the first embodiment of the present invention, a proper amount of Zn for achieving the function as a window structure is diffused in part of the infrared laser active layer 102 located in a light emitting edge surface vicinity region and part of the red laser active layer 105 located in a light emitting edge surface vicinity region by a single Zn diffusion step, so that the same effects as those of the semiconductor laser device according to the first embodiment of the present invention can be achieved.

Furthermore, in the semiconductor laser device according to the second embodiment of the present invention, compared to the semiconductor laser device according to the first embodiment of the present invention, the concentration of a p-type impurity contained in the infrared laser p-type cladding layer 103 and the concentration of a p-type impurity contained in the red laser p-type cladding layer 106 are increased.

In the semiconductor laser device according to the first embodiment of the present invention, a carrier concentration in the infrared laser p-type cladding layer 103 is $5\times10^{17}$ cm$^{-3}$ and a carrier concentration in the red laser p-type cladding layer 106 is $3\times10^{17}$ cm$^{-3}$ (see Table 1).

In contrast, the semiconductor laser device according to the second embodiment of the present invention, as shown in Table 2, a carrier concentration in the infrared laser p-type cladding layer 103 is $1.5\times10^{18}$ cm$^{-3}$ and a carrier concentration of the red laser p-type cladding layer 106 is $1.5\times10^{18}$ cm$^{-3}$.

As described above, in the semiconductor laser device according to the second embodiment of the present invention, each of the concentration of a p-type impurity, i.e., Mg contained in the infrared laser p-type cladding layer 103 and the concentration of a p-type impurity, i.e., Zn contained in the red laser p-type cladding layer 106 is adjusted to be within a range from $6\times10^{17}$ cm$^3$ or more to $1.6\times10^{18}$ cm$^{-3}$ or less.

Accordingly, in the semiconductor laser device according to the second embodiment of the present invention, a reactive current generated in each of the infrared laser active layer 102 and the red laser active layer 105 can be reduced, so that heat saturation can be prevented in the infrared laser active layer 102 and the red laser active layer 105. Therefore, a semiconductor laser device capable of higher output power operation (e.g., light emission at 350 mW) can be provided.

In contrast with the semiconductor laser device according to the first embodiment of the present invention in which Zn is used as a p-type impurity contained in the infrared laser p-type cladding layer 103 (see Table 1), as shown in Table 2, Mg is used as a p-type impurity contained in the infrared laser p-type cladding layer 103 at a high concentration in the semiconductor laser device according to the second embodiment of the present invention.

In this manner, in the semiconductor laser device according to the second embodiment of the present invention, a different p-type impurity from Zn is selected as a p-type impurity contained in the infrared laser p-type cladding layer 103 at a high concentration so that a diffusion rate of a p-type impurity (e.g., Mg) in the infrared laser p-type cladding layer 103 becomes smaller than the Zn diffusion rate in the infrared laser p-type cladding layer 103.

Therefore, the semiconductor laser device according to the second embodiment of the present invention, the p-type impurity, i.e., Mg contained in the infrared laser p-type cladding layer 103 at a high concentration can be prevented from passing through the infrared laser p-type cladding layer 103 and being diffused in the infrared laser active laser 102. Thus, the concentration of the p-type impurity, i.e., Mg contained in the infrared laser p-type cladding layer 103 can be increased.

Furthermore, in the semiconductor laser device according to the second embodiment of the present invention, the p-type impurity, i.e., Mg contained in the infrared laser p-type cladding layer 103 does not pass through the infrared laser p-type cladding layer 103 and is not diffused in the infrared laser active layer 102. Accordingly, non-radiative recombination of carriers is not facilitated, so that degradation of properties of the semiconductor laser device can be prevented.

In the semiconductor laser device according to the second embodiment of the present invention, as shown in Table 2, Zn is used as a p-type impurity contained in the red laser p-type cladding layer 106 at a high concentration. However, in the semiconductor laser device according to the second embodiment of the present invention, an adjustment is made so that the Zn diffusion rate in the red laser p-type cladding layer 106 becomes smaller than the Zn diffusion rate in the infrared laser p-type cladding layer 103. Accordingly, the p-type impurity, i.e., Zn contained in the red laser p-type cladding layer 106 at a high concentration does not pass through the red laser p-type cladding layer 106 and is not diffused in the red laser active layer 105, so that the concentration of the p-type impurity, i.e., Zn contained in the red laser p-type cladding layer 106 can be increased.

Hereafter, a method for fabricating a semiconductor laser device according to the second embodiment of the present invention will be briefly described.

The semiconductor laser device according to the second embodiment of the present invention includes the same components as the above-described components of the semiconductor laser device according to the first embodiment of the present invention. Therefore, the semiconductor laser device of this embodiment can be fabricated through the same process steps as those of the above-described method for fabricating a semiconductor laser device according to the first embodiment of the present invention.

In the method for fabricating a semiconductor laser device according to the second embodiment of the present invention, as shown in FIG. 1A, when the step of forming infrared laser semiconductor layers 101 through 103 by MOCVD is performed, not only the lattice constant of the infrared laser p-type cladding layer 103 but also the concentration of the p-type impurity, i.e., Mg contained in the infrared laser p-type cladding layer 103 are controlled with high accuracy in a simple manner.

In the same manner, in the method for fabricating a semiconductor laser device according to the second embodiment of the present invention, as shown in FIG. 1C, when performing the step of forming red laser semiconductor layers 104 through 106 by MOCVD, not only the lattice constant of the red laser p-type cladding layer 106 but also the concentration of the p-type impurity, i.e., Zn contained in the red laser p-type cladding layer 106 are controlled with high accuracy in a simple manner.

Thus, by the method for fabricating a semiconductor laser device according to the second embodiment of the present invention, an adjustment can be made so that the lattice constant of the infrared laser p-type cladding layer 103 becomes smaller than the lattice constant of the substrate 100 and also smaller than the lattice constant of the red laser p-type cladding layer 106, and also the concentration of the p-type impurity, i.e., Mg contained in the infrared laser p-type cladding layer 103 and the concentration of the p-type impurity, i.e., Zn contained in the red laser p-type cladding layer 106 can be increased.

In the method for fabricating a semiconductor laser device according to the second embodiment of the present invention, as in the method for fabricating a semiconductor laser device according to the first embodiment of the present invention, an adjustment is made so that a lattice mismatch value of the infrared laser p-type cladding layer 103 to the substrate 100 is smaller than 0 and also smaller than a lattice mismatch value of the red laser p-type cladding layer 106 to the substrate 100. Thus, as shown in FIG. 2B, by a single Zn diffusion step, an excellent window region can be formed in part of the infrared laser active layer 102 located in a light emitting edge surface vicinity region 200a and an excellent window region can be formed in part of the red laser active layer 105 located in a light emitting edge surface vicinity region 200b. Therefore, the same effects as those of the method for fabricating a semiconductor laser device according to the first embodiment of the present invention can be achieved.

Furthermore, by the method for fabricating a semiconductor laser device according to the second embodiment of the present invention, the concentration of the p-type impurity, i.e., Mg contained in the infrared laser p-type cladding layer 103 and the concentration of the p-type impurity, i.e., Zn contained in the red laser p-type cladding layer 106 can be reduced. Therefore, compared to the semiconductor laser device according to the first embodiment of the present invention, a semiconductor laser device capable of higher output power operation can be provided.

In the method for fabricating a semiconductor laser device according to the second embodiment of the present invention, Mg is used as a p-type impurity contained in the infrared laser p-type cladding layer 103 at a high concentration.

Thus, by the method for fabricating a semiconductor laser device according to the second embodiment of the present invention, when the step of forming red laser semiconductor lasers 104 through 106 by MOCVD (see FIG. 1C) and the Zn diffusion step (see FIG. 2B) are performed after the step of forming infrared laser semiconductor layers 101 through 103, the p-type impurity, i.e., Mg contained in the infrared laser p-type cladding layer 103 at a high concentration can be prevented from passing through the infrared laser p-type cladding layer 103 and is being diffused in the infrared laser active layer 102.

Note that the semiconductor laser device according to the second embodiment of the present invention has been described using a double wavelength laser device as a specific example. However, the present invention is not limited thereto. The present invention can be effectively applied to, for example, a monolithic integrated laser device such as a triple wavelength laser device or a single body infrared laser device.

For example, when the present invention is applied to a single body infrared laser device, an adjustment can be made, based on a Zn diffusion rate in an infrared laser active layer, so that a lattice constant of an infrared laser p-type cladding layer becomes smaller than a lattice constant of a substrate, thereby facilitating Zn diffusion in the infrared laser active layer.

Thus, a proper amount of Zn (e.g., $2 \times 10^{18}$ cm$^{-3}$ or more) for achieving the function as a window structure can be diffused in a simple manner in part of the infrared laser active layer located in a light emitting edge surface vicinity region. Therefore, an infrared laser active layer having an excellent window region in its light emitting edge surface vicinity part can be achieved in a simple manner.

Furthermore, when the present invention is applied to a single body infrared laser device, as in the semiconductor laser device according to the second embodiment of the present invention, the concentration of a p-type impurity, i.e., Mg contained in an infrared laser p-type cladding layer is increased, thereby realizing a semiconductor laser device capable of high output power operation.

In the above-described manner, by application of the present invention to a single body infrared laser device, an infrared laser active layer having an excellent window region in its light emitting edge surface vicinity part can be achieved, and also a semiconductor laser device capable of high output power operation can be provided.

As has been described, the present invention is useful for a semiconductor laser device having a window structure and a method for fabricating the semiconductor laser device.

What is claimed is:

1. A double wavelength laser device comprising:
a first light emitting device for emitting laser light of a first wavelength, the first light emitting device including a first first-conductive-type cladding layer, a first active layer having a first window region in part thereof located in the vicinity of a light emitting edge surface and a first second-conductive-type cladding layer stacked in this order on a substrate; and
a second light emitting device for emitting laser light of a second wavelength, the second light emitting device including a second first-conductive-type cladding layer, a second active layer having a second window region in part thereof located in the vicinity of a light emitting edge surface and a second second-conductive-type cladding layer stacked in this order on the substrate,
wherein the first active layer is a layer containing AlGaAs,
wherein the second active layer is a layer containing AlGaInP,
wherein each of the first second-conductive-type cladding layer and the second second-conductive-type cladding layer is a layer containing AlGaInP, and
wherein a lattice mismatch value of the first second-conductive-type cladding layer is less than 0 and also less than a lattice mismatch value of the second second-conductive-type cladding layer.

2. The double wavelength laser device of claim 1, wherein the lattice mismatch value of the first second-conductive-type cladding layer to the substrate is $-3.0 \times 10^{-3}$ or more and less than $-5.0 \times 10^{-4}$,
the lattice mismatch value of the second second-conductive-type cladding layer to the substrate is $-5.0 \times 10^{-4}$ or more and $2.0 \times 10^{-3}$ or less.

3. The double wavelength laser device of claim 1, wherein each of the impurity contained in the first window region and the impurity contained in the second window region contains Zn.

4. The double wavelength laser device of claim 1, wherein the first second-conductive-type cladding layer contains a chemical compound expressed by a general formula of $(Al_xGa_{1-x})yIn_{1-y}P$ where $0 \leqq x \leqq 1$ and $0 \leqq y \leqq 1$, wherein the second second-conductive-type cladding layer contains a chemical compound expressed by a general formula of $(Al_tGa_{1-t})_uIn_{1-u}P$ where $0 \leqq t \leqq 1$ and $0 \leqq u \leqq 1$, and wherein x and t satisfy the relationship of x<t.

5. The double wavelength laser device of claim 1, wherein a first second-conductive type impurity contained in the first second-conductive-type cladding layer is a different element from the impurity contained in the first window region, wherein a diffusion rate of the first second-conductive-type impurity in the first second-conductive-type cladding layer is smaller than a diffusion rate of the impurity contained in the first window region in the first second-conductive-type cladding layer.

6. The double wavelength laser device of claim 5, wherein the first second-conductive-type impurity contains Mg.

7. The double wavelength laser device of claim 5, wherein each of a concentration of the first second-conductive-type impurity contained in the first second-conductive-type cladding layer and a concentration of a second second-conductive-type impurity contained in the second second-conductive-type cladding layer is $6 \times 10^{17}$ cm$^{-3}$ or more and $1.6 \times 10^{18}$ cm$^{-3}$ or less.

8. The double wavelength laser device of claim 1, wherein at least one of the first active layer and the second active layer has a quantum well structure.

* * * * *